(12) United States Patent
Yeh

(10) Patent No.: US 12,603,134 B2
(45) Date of Patent: Apr. 14, 2026

(54) NOR MEMORY CELL WITH FLOATING GATE

(71) Applicant: Greenliant IP, LLC, Santa Clara, CA (US)

(72) Inventor: Bing Yeh, Los Altos Hills, CA (US)

(73) Assignee: Greenliant IP, LLC, Santa Clara, CA (US)

( * ) Notice: Subject to any disclaimer, the term of this patent is extended or adjusted under 35 U.S.C. 154(b) by 60 days.

(21) Appl. No.: 18/429,938

(22) Filed: Feb. 1, 2024

(65) Prior Publication Data

US 2024/0265976 A1     Aug. 8, 2024

Related U.S. Application Data

(60) Provisional application No. 63/626,450, filed on Jan. 29, 2024, provisional application No. 63/443,343, filed on Feb. 3, 2023.

(51) Int. Cl.
G11C 16/14 (2006.01)
G11C 5/06 (2006.01)
(Continued)

(52) U.S. Cl.
CPC .............. G11C 16/14 (2013.01); G11C 5/063 (2013.01); G11C 16/34 (2013.01); H10B 41/27 (2023.02); H10D 30/6892 (2025.01)

(58) Field of Classification Search
CPC ......... G11C 16/14; G11C 5/063; G11C 16/34; H10B 41/27; H10D 30/6892; H10D 30/0411; H10D 30/681
(Continued)

(56) References Cited

U.S. PATENT DOCUMENTS

| | | | |
|---|---|---|---|
| 6,034,892 A | 3/2000 | Choi | |
| 6,768,165 B1 | 7/2004 | Eitan | |
| | (Continued) | | |

FOREIGN PATENT DOCUMENTS

| | | |
|---|---|---|
| CN | 101022112 A | 8/2007 |
| CN | 101419972 A | 4/2009 |
| | (Continued) | |

OTHER PUBLICATIONS

Greenliant IP LLC, Partial Search Report, PCT/US2024/014278, May 28, 2024, 11 pgs.
(Continued)

*Primary Examiner* — Fernando Hidalgo
(74) *Attorney, Agent, or Firm* — Morgan, Lewis & Bockius LLP

(57) ABSTRACT

An electrically erasable programmable nonvolatile memory cell includes a semiconductor substrate having a bit line region, a surface region apart from the bit line region in a lateral direction, and a trench region apart from the surface region in the lateral direction, the trench region comprising a bottom portion and a sidewall portion adjacent a trench in the semiconductor substrate; an electrically conductive control gate; an electrically conductive word line; and a floating gate insulated from the substrate and the word line and comprising: a first tip substantially aligned with the sidewall portion of the trench region of the substrate; and a second tip self-aligned with an edge of the word line that is farthest from the second portion of the control gate.

20 Claims, 32 Drawing Sheets

(51) Int. Cl.
| | |
|---|---|
| *G11C 16/34* | (2006.01) |
| *H10B 41/27* | (2023.01) |
| *H10D 30/68* | (2025.01) |

(58) Field of Classification Search
USPC ..................................................... 365/185.29
See application file for complete search history.

(56) References Cited

U.S. PATENT DOCUMENTS

| | | | |
|---|---|---|---|
| 6,885,585 | B2 | 4/2005 | Maayan et al. |
| 7,192,832 | B2 | 3/2007 | Chang et al. |
| 7,253,468 | B2 | 8/2007 | Jung |
| 8,693,243 | B2 | 4/2014 | Gu et al. |
| 8,778,761 | B2 | 7/2014 | Gu et al. |
| 9,293,204 | B2 | 3/2016 | Do et al. |
| 9,583,640 | B1 | 2/2017 | Richter et al. |
| 10,600,797 | B2 | 3/2020 | Yeh |
| 10,700,174 | B2 | 6/2020 | Liu |
| 10,756,100 | B2 | 8/2020 | Yeh |
| 11,075,214 | B2 | 7/2021 | Yeh |
| 11,101,277 | B2 | 8/2021 | Yeh |
| 11,600,627 | B2 | 3/2023 | Yu |
| 11,616,071 | B2 | 3/2023 | Yeh |
| 2004/0183118 | A1 | 9/2004 | Chen et al. |
| 2004/0183121 | A1 | 9/2004 | Yeh et al. |
| 2004/0238852 | A1 | 12/2004 | Lee et al. |
| 2005/0045940 | A1 | 3/2005 | Chen |
| 2005/0087796 | A1 | 4/2005 | Jung |
| 2006/0043459 | A1 | 3/2006 | Chen |
| 2006/0157773 | A1 | 7/2006 | Yu et al. |
| 2006/0223262 | A1 | 10/2006 | Zheng et al. |
| 2006/0234444 | A1 | 10/2006 | Wu |
| 2007/0262368 | A1 | 11/2007 | Chang et al. |
| 2008/0042183 | A1 | 2/2008 | Mokhlesi |
| 2011/0057247 | A1 | 3/2011 | Hu et al. |
| 2015/0214315 | A1 | 7/2015 | Fan et al. |
| 2019/0027487 | A1 | 1/2019 | Chen et al. |
| 2019/0088667 | A1 | 3/2019 | Yeh |
| 2019/0088668 | A1 | 3/2019 | Yeh |
| 2019/0165115 | A1 | 5/2019 | Lin et al. |
| 2020/0303387 | A1 | 9/2020 | Yeh |
| 2020/0365608 | A1 | 11/2020 | Yeh |
| 2021/0358932 | A1 | 11/2021 | Yeh |
| 2022/0101920 | A1* | 3/2022 | Wang ..................... G11C 16/16 |
| 2022/0216316 | A1* | 7/2022 | Wang ................. G11C 16/0425 |
| 2022/0293756 | A1* | 9/2022 | Xing .................. H10D 30/6892 |
| 2022/0416076 | A1 | 12/2022 | Yeom et al. |

FOREIGN PATENT DOCUMENTS

| | | | |
|---|---|---|---|
| CN | 104091802 | A | 10/2014 |
| CN | 102117814 | B | 8/2015 |
| CN | 102938406 | B | 12/2016 |
| CN | 106415851 | A | 2/2017 |
| CN | 111341776 | A | 6/2020 |
| CN | 113224068 | A | 8/2021 |
| EP | 1059673 | A2 | 12/2000 |
| JP | H 1070205 | A | 3/1998 |
| JP | 2001057395 | A | 2/2001 |
| JP | 2001085543 | A | 3/2001 |
| JP | 2001085544 | A | 3/2001 |
| JP | 2001223281 | A | 8/2001 |
| JP | 2001284473 | A | 10/2001 |
| JP | 2002076149 | A | 3/2002 |
| JP | 2003303908 | A | 10/2003 |
| JP | 2004186452 | A | 7/2004 |
| TW | 411626 | B | 11/2000 |

OTHER PUBLICATIONS

Greenliant Systems, Ltd., Japanese Office Action, JP Application No. 2021-554396, Jan. 29, 2024, 14 pgs.

Greenliant IP LLC, ISR/WO, PCT/US2024/014278, Aug. 28, 2024, 21 pgs.

Greenliant IP LLC, International Search Report / Written Opinion, PCT/US2018/049875, Nov. 27, 2018, 11pgs.

Greenliant IP LLC, International Preliminary Report on Patentability, PCT/US2018/049875, Mar. 27, 2020, 9 pgs.

Greenliant IP LLC, International Search Report / Written Opinion, PCT/US2018/049877, Nov. 29, 2018, 9pgs.

Greenliant IP LLC, International Preliminary Report on Patentability, PCT/US2018/049877, Mar. 17, 2020, 7 pgs.

Greenliant IP LLCc, International Search Report / Written Opinion, PCT/US2020/023925, Jul. 7, 2020, 10 pgs.

Greenliant IP LLC, International Preliminary Report on Patentability, PCT/US2020/023925, Sep. 16, 2021, 8 pgs.

Greenliant Systems, Ltd., CN Office Action, Chinese Application No. 201880058769.5, Jan. 19, 2023, 14 pgs.

Greenliant Systems, Ltd., CN Office Action, Chinese Application No. 201880058770.8, Mar. 16, 2023, 13 pgs.

Greenliant Systems, Ltd., EP Office Action, European Application No. 18780267.3, Nov. 14, 2022, 4 pgs.

Greenliant Systems, Ltd., EP Office Action, European Application No. 20719042.2, Oct. 17, 2022, 4 pgs.

Greenliant Systems, Ltd., JP Office Action, Japanese Application No. 2020-508322, Sep. 22, 2022, 5 pgs.

Greenliant Systems, Ltd., JP Office Action, Japanese Application No. 2020-508343, Oct. 19, 2022, 19 pgs.

Greenliant Systems, Ltd., TW Office Action, Taiwanese Application No. 107127198, Mar. 2, 2021, 7 pgs.

Greenliant Systems, Ltd., TW Office Action, Taiwanese Application No. 107127199, Mar. 5, 2021, 12 pgs.

Greenliant Systems, Ltd., TW Office Action, Taiwanese Application No. 109109513, Jul. 6, 2022, 4 pgs.

Greenliant Systems, Ltd., TW Office Action, Taiwanese Application No. 109109513, Feb. 17, 2023, 4 pgs.

Greenliant Systems, Ltd., US Non-Final Office Action, U.S. Appl. No. 16/122,800, Jul. 10, 2019, 7 pgs.

Greenliant Systems, Ltd., US Non-Final Office Action, U.S. Appl. No. 16/122,795, Aug. 28, 2019, 19 pgs.

Greenliant Systems, Ltd., US Final Office Action, U.S. Appl. No. 16/122,795, Dec. 27, 2019, 16 pgs.

Greenliant Systems, Ltd., US Non-Final Office Action, U.S. Appl. No. 17/385,793, Aug. 2, 2022, 16 pgs.

Greenliant Systems, Ltd., US Non-Final Office Action, U.S. Appl. No. 16/825,808, Oct. 5, 2020, 7 pgs.

Greenliant Systems, Ltd., US Notice of Allowance, U.S. Appl. No. 16/122,800, Nov. 18, 2019, 7 pgs.

Greenliant Systems, Ltd., US Notice of Allowance, U.S. Appl. No. 16/122,795, Apr. 8, 2020, 8 pgs.

Greenliant Systems, Ltd., US Notice of Allowance, U.S. Appl. No. 16/122,795, May 6, 2020, 8 pgs.

Greenliant Systems, Ltd., US Notice of Allowance, U.S. Appl. No. 16/824,384, Feb. 12, 2021, 8 pgs.

Greenliant Systems, Ltd., US Notice of Allowance, U.S. Appl. No. 16/824,384, Apr. 15, 2021, 8 pgs.

Greenliant Systems, Ltd., US Notice of Allowance, U.S. Appl. No. 16/825,808, Nov. 30, 2020, 3 pgs.

Greenliant Systems, Ltd., US Notice of Allowance, U.S. Appl. No. 16/825,808, Dec. 31, 2020, 4 pgs.

Greenliant Systems, Ltd., US Notice of Allowance, U.S. Appl. No. 16/825,808, Mar. 26, 2021, 6 pgs.

Greenliant Systems, Ltd., US Notice of Allowance, U.S. Appl. No. 16/825,808, Apr. 14, 2021, 2 pgs.

Greenliant Systems, Ltd., US Notice of Allowance, U.S. Appl. No. 16/825,808, Jun. 14, 2021, 2 pgs.

Greenliant Systems, Ltd., US Notice of Allowance, U.S. Appl. No. 16/824,384, Jul. 21, 2021, 2 pgs.

* cited by examiner

100

101

124a

CG/EG

120

130    WL    160    160    WL    130

132

B

140

FG 150

144   142

124

140

150 FG

111

104

105

162

154   164   152

106

A

122

106

105

104

BL

BL

108b

108b

102

109

108a nitride
oxide
FG
oxide

800

Floating Gate

Word Line

EG/CG Line

Bit Line L          Bit Line R

Floating Gate

Word Line

EG/CG

Bit Line

100Å Silicon Nitride (Si3N4) 1010
20Å oxide 1008
20Å ALD TaN FG material 1006
100Å FG dielectric 1004 (thermal SiO2, or low-trap Si3N4)
Substrate 1002

1014

1012

1016

1110

1108

1106

1104

1102

1112          1112

1118
1116
1114

1120

130

150

1142

1144

1142

1144

Poly2, coupling oxide and partial poly1 etch

Offset SPR dep

Offset SPR etch

Tunneling injector formation

1216

1214

1212

1210

1208
1206

1204

1202

1224

1222

1226

1224 1228

1224

1222

1230

1222

1232

2nd Tunnel oxide dep

Trench Implant

Trench Etch

1222

1236 offset gap
1238

Figure 12J

1st Tunnel oxide dep 1234
1224
1228

Poly etch

1250

SiN remove

1248

Planar oxide CMP

1246

W etch back

1244

1214
1212
1210
1208
1206
1204
1202

Spacer 2

Oxide etch

Spacer 1

Poly Re-ox

Cell N+ & LDD
Implant

DEEP HALO
Implant

WL HM Spacer Dep/etch

1324

Trench Open

1322

1320

Poly2/ Stacking Oxide, SiN, Oxide dep 1316
1314
1312
1310

FG Oxide/ TaN/ Oxide cap 1308
1306
1304
1302

Figure 13L
2nd Tunnel oxide dep

Figure 13K
Trench Implant

Figure 13J
Trench Etch

Figure 13I
1st Tunnel oxide dep

Poly etch

SiN remove

Planar oxide CMP

W etch back

Spacer 2

1358

Oxide etch

1356

Spacer 1

1354

Poly Re-ox

1352

Cell N+ & LDD
Implant

DEEP HALO
Implant

NOR MEMORY CELL WITH FLOATING GATE

RELATED APPLICATIONS

This application claims priority to U.S. Provisional Patent Application No. 63/626,450, filed Jan. 29, 2024, and U.S. Provisional Patent Application No. 63/443,343, filed Feb. 3, 2023, both of which are hereby incorporated by reference in their entireties.

This application is also related to U.S. patent application Ser. No. 16/122,795, filed Sep. 5, 2018 and issued as U.S. Pat. No. 10,756,100 on Aug. 25, 2020, U.S. patent application Ser. No. 16/122,800, filed Sep. 5, 2018 and issued as U.S. Pat. No. 10,600,797 on Mar. 24, 2020, U.S. patent application Ser. No. 16/824,384, filed Mar. 19, 2020 and issued as U.S. Pat. No. 11,101,277 on Aug. 24, 2021, U.S. patent application Ser. No. 16/825,808, filed Mar. 20, 2020 and issued as U.S. Pat. No. 11,075,214 on Jul. 27, 2021, and U.S. patent application Ser. No. 17/385,793, filed Jul. 26, 2021, now U.S. Pat. No. 11,616,071 on Mar. 28, 2023, each of which is hereby incorporated by reference in its entirety.

TECHNICAL FIELD

This relates generally to semiconductor memory devices, including but not limited to electrically programmable and erasable nonvolatile memory cells, sometimes called NOR memory cells, having a floating gate.

BACKGROUND

While programming a nonvolatile semiconductor memory cell array, e.g., a traditional stacked-gate memory cell in which each memory cell has a floating gate and a control gate, in order to "inject" electrons onto the floating gate, accelerated electrons traveling in a depletion region and in a direction that is at least partially away from the floating gate must collide with impurities or lattice imperfections in the substrate to generate momentum in a direction toward the floating gate. Further, only those electrons having sufficient energy in the direction of the floating gate to overcome the energy barrier at the silicon-oxide interface (i.e., substrate-gate oxide interface) plus the potential change across the floating gate oxide will be injected onto the floating gate. As a result, efficiency of programming operations is highly dependent on the direction and energy of the programming electrons.

Electric fields within a memory cell may interfere with the traveling direction of electrons during programming operations. Such fields may pull electrons in directions that are not optimal for injecting onto the floating gate. Memory cell structures may be adjusted in order to overcome competing electric fields and maintain optimal electron traveling direction during programming operations. However, such adjustments may affect threshold voltages of particular gates in a way that negatively affects other operations of the memory cell. For example, read current is sensitive to control gate voltage thresholds. As such, optimizing the memory cell for programming efficiency may make the memory cell less efficient during other operations, thereby posing design trade-offs.

SUMMARY

Accordingly, there is a need to improve the programming efficiency of nonvolatile memory cells in a way that minimizes the impact on other operations. This disclosure describes devices and methods that are configured to increase programming efficiency while maintaining sufficiently high read current when the cell is erased. The memory cell structure as described herein includes a plurality of indium implants that are strategically placed throughout the substrate of the memory cell. These implants, combined with the specific architecture of the memory cell, advantageously solves the trade-off between programming efficiency and read current-affecting threshold voltages.

In accordance with some embodiments, an electrically erasable programmable nonvolatile memory cell, sometimes called a NOR memory cell, includes a semiconductor substrate having a bit line region, a surface region apart from the bit line region in a lateral direction, and a trench region apart from the surface region in the lateral direction, the trench region comprising a bottom portion and a sidewall portion adjacent a trench in the semiconductor substrate; an electrically conductive control gate comprising: a first portion disposed inside the trench, insulated from the bottom and sidewall portions of the trench region of the substrate, and apart from the sidewall portion of the trench region by a first distance in the lateral direction; and a second portion disposed above and extending away from the trench; an electrically conductive word line insulated from the control gate and offset from the second portion of the control gate by a second distance greater than the first distance in the lateral direction; a tantalum nitride floating gate insulated from the substrate and the word line and comprising: a first end substantially aligned with the sidewall portion of the trench region of the substrate; and a second end self-aligned with an edge of the word line that is farthest from the second portion of the control gate.

In some embodiments, the electrically erasable programmable nonvolatile memory cell includes two or more of: a first indium implant disposed in a region of the substrate below the bottom portion of the trench region; a second indium implant disposed in a region of the substrate adjacent to the sidewall portion and the surface region of the substrate; and a third indium implant disposed in a region of the substrate adjacent to a lower portion of a source or drain node of the memory cell.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

DESCRIPTION OF EMBODIMENTS

Figure 1:
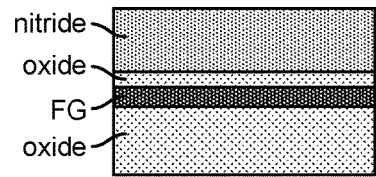
FIG. 1 is a diagram illustrating a cross section view of a pair of electrically erasable programmable nonvolatile memory cells in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are only used to distinguish one element from another. For example, a first contact could be termed a second contact, and, similarly, a second contact could be termed a first contact, without departing from the scope of the various described embodiments. The first contact and the second contact are both contacts, but they are not the same contact, unless the context clearly indicates otherwise.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. The terms "first," "second," etc. are only used to distinguish one element from another and do not limit the elements themselves. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when," or "upon," or "in response to determining," or "in response to detecting," depending on the context. Similarly, the phrase "if it is determined" or "if [a stated condition or event] is detected" is, optionally, construed to mean "upon determining," or "in accordance with a determination that," or "in response to determining" or "upon detecting [the stated condition or event]" or "in response to detecting [the stated condition or event]," depending on the context.

Unless otherwise stated, all distances, material thicknesses, electrical voltages and currents included in the following descriptions are examples, and are to be assumed to be specified within a margin of ten percent. For example, unless otherwise stated, a stated distance or thickness of 200 Å includes a margin of 10%, and thus a range of 180 Å to 220 Å.

Attention is now directed toward embodiments of an electrically erasable programmable nonvolatile memory cell, sometimes called a NOR memory cell or split-gate NOR memory cell, in accordance with some embodiments. FIG. 1 is a cross section of a pair of memory cells 100, 101. The memory cells mirror each other, with a memory cell formed on each side of, and including, a shared control/erase gate 120. In the interest of brevity, the remainder of this disclosure references only one memory cell, memory cell 100. However, it is appreciated that the mirror memory cell 101 (the neighboring memory cell) has corresponding features and behaves similarly under similar circumstances.

In some embodiments, memory cell 100 includes a semiconductor substrate 102 having a bit line region 104 (sometimes called a drain region or a source region), a surface region 106 apart from the bit line region in a lateral direction, and a trench region 108a/108b apart from the surface region in the lateral direction, the trench region comprising a bottom portion 108a adjacent to a bottom surface of a trench 109 in the substrate 102, and a sidewall portion 108b adjacent to a sidewall of the trench 109. In some embodiments, the sidewall portion 108b of the trench region is substantially perpendicular to surface 111 of the substrate. In some embodiments, bit line region 104 serves as a drain or a source; it is appreciated that the drain and source of a transistor can be switched during operation. Furthermore, in some embodiments, bit line region 104 includes substrate region 105, which is a shallower doped region (e.g., a moderately N-doped region in a P doped substrate) than bit line region 104. In some embodiments, region 105, sometimes called the LDD region, is not moderately N-doped, thereby increasing the threshold voltage needed to conduct current through the channel (along the surface of the substrate) between the bit line region 104 and the bit line region of the other memory cell.

Substrate 102 further includes a surface region 106. Surface region 106 is disposed between bit line region 104 and trench sidewall portion 108b. Substrate 102 further includes a horizontal surface 111, disposed over the bit line region 104 and extending in a lateral direction towards the trench sidewall portion 108b. Surface region 106 includes a portion of surface 111 between bit line region 104 and trench sidewall portion 108b. In some embodiments, at least a portion of surface 111 is a silicon-oxide interface (e.g., between a silicon substrate and an oxide-based insulation region). For the purposes of this disclosure, the term "trench" describes a region (109) from which substrate material (102) has been removed, and thus an absence of substrate material, while the terms "trench region" (108a/ 108b), "bottom portion" (108a), and "sidewall portion" (108b) describe regions of the substrate 102 adjacent to the trench 109.

In some embodiments, memory cell 100 further includes an electrically conductive control/erase gate 120 (alternatively referred to as an control gate, or an erase gate). Control/erase gate 120 functions as a control gate or an erase gate depending on a mode of operation of the memory cell 100. For example, when the memory cell 100 (specifically, floating gate 150) is being written to or read from, gate 120 functions as a control gate, and when the memory cell 100 (specifically, floating gate 150) is being erased, gate 120 functions as an erase gate.

Control/erase gate 120 includes a first portion 122 disposed inside trench 109, insulated from the bottom portion 108*a* and sidewall portion 108*b* of the trench region of substrate 102, and apart from the trench sidewall portion 108*b* by a first distance A in the lateral direction. Control/ erase gate 120 further includes a second portion 124 disposed above the first portion 122 and extending away from the trench 109. In some embodiments, first control/erase gate portion 122 and the second control/erase gate portion 124 are heavily doped (e.g., n+) polysilicon, or alternatively are (or include) metal (e.g. tungsten). In some embodiments, second control/erase gate portion 124 includes a region 124*a* extending in the lateral direction at an end of the memory cell 100 farthest from the substrate 102. Since region 124*a* is substantially orthogonal (e.g., making an angle between 45° and 135°) to the first portion 122 and lower region of second portion 124 of control/erase gate 120, the control/ erase gate 120 may be referred to as a T-shaped gate. In some embodiments, region 124*a* includes a self-aligned metal silicide (sometimes referred to as a salicide), which increases the conductivity of the control/erase gate. Stated another way, a metal contact (silicide) is added on top of region 124*a*, both for providing signals or reference voltages to the control/erase gate 120 and for increasing the conductivity of the control/erase line.

In some embodiments, memory cell 100 further includes an electrically conductive word line 130 (optionally referred to as a gate) insulated from the control/erase gate 120 and offset from the second portion of the control/erase gate 124 by a second distance B greater than the first distance A in the lateral direction. Word line 130 is further disposed above and insulated from floating gate 150.

In some embodiments, memory cell 100 further includes an electrically conductive floating gate 150 insulated from the substrate 102 and the word line 130. Floating gate 150 includes a first end 152 substantially aligned with the sidewall portion 108*b* of the trench region of the substrate 102 (more specifically, substantially aligned with the sidewall of the trench), and a second end 154 self-aligned with an edge 132 of the word line 130 that is farthest from the second portion 124 of the control/erase gate. In some embodiments, the first end 152 of the floating gate includes a pointed tip, a portion of which has a smaller cross section than a cross section of the second end 154 of the floating gate. In some embodiments, floating gate 150 is substantially parallel to surface 111 of the substrate. In some embodiments, the capacitive coupling between floating gate 150 and control/erase gate 120 is very small, due to the floating gate thickness being very thin, e.g., 20 Å or thinner; therefore, the cross-section area of the floating gate end 152 facing control/erase gate 120 is much smaller than that of the word line 130 disposed on top of floating gate 120. This small capacitive coupling, in combination with the wider spacing B (between the control/erase gate 120 and the word line 130) relative to the spacing A (between the control/erase gate 120 and the floating gate 150), enables the thin floating gate edge 152 to serve as an efficient tunneling injector. As a result, a relatively lower voltage is needed for erase operations, as described in detail below with reference to FIG. 2.

In some embodiments, memory cell 100 further includes a dielectric layer 140 between floating gate 150 and word line 130. Dielectric layer 140 is a "thin" dielectric layer, so as to provide a strong capacitive coupling between floating gate 150 and word line 130. In some embodiments, dielectric layer 140 comprises oxide, nitride, a combination of oxide and nitride, or other high dielectric constant material. In some embodiments, dielectric layer 140 has a combined total thickness between 8 nm and 10 nm. In some embodiments, as a result of the manufacturing process, dielectric layer 140 includes a first portion 142 substantially aligned with the first end 152 of the floating gate and the sidewall portion 108*b* of the trench region of the substrate, and a second portion 144 substantially aligned with the second end 154 of the floating gate and the edge 132 of the word line that is farthest from the second portion 124 of the control gate.

In some embodiments, memory cell 100 further includes insulation material 160 between control/erase gate 120 and word line 130, between control/erase gate 120 and floating gate 150, between control/erase gate 120 and substrate 102, and between control/erase gate 120 and dielectric layer 140. In some embodiments, insulation material 160 comprises oxide, nitride, a combination of oxide and nitride, or other dielectric material. In some embodiments, compared with a conventional silicon oxide layer, insulation material 160 provides a lower capacitive coupling between control/erase gate 120 and word line 130.

In some embodiments, memory cell 100 further includes an erase gate insulation region 162 disposed between the first end 152 of the floating gate 150 and the second portion 124 of the control/erase gate 120, the erase gate insulation region 162 having a thickness permitting tunneling of electrons from the first end 152 of the floating gate to the second portion 124 of the control/erase gate during an erase operation. In some embodiments, the erase gate insulation region thickness is greater than 120 Å and permits tunneling of electrons upon application of no greater than 7V between the control gate and the floating gate.

In some embodiments, memory cell 100 further includes a floating gate insulation region 164 (e.g., sometimes herein called a floating gate oxide 164) disposed between the surface portion 111 of the substrate and the floating gate 150. The floating gate insulation region 164 has a thickness permitting head-on injection of electrons traveling in an upward path to the floating gate during a program operation. In some embodiments, the floating gate insulation region 164 has a thickness of at least 100 Å, which prevents floating gate charge loss, even in high temperature environments, thereby increasing charge retention of the memory cell, which increases the memory cell's product life.

In some embodiments, conductive elements of the memory cell 100 (e.g., control/erase gate 120, floating gate 150, and/or word line 130) are constructed of appropriately doped polysilicon. It is appreciated that "polysilicon" refers to any appropriate conductive material, formed at least in part from silicon or metal material, that can be used to form the conductive elements of nonvolatile memory cells. In some embodiments, floating gate 150 is constructed of tantalum nitride, which can be very stable thermally, even up to 1000° C. In some embodiments, floating gate 150 may have a thickness of as little as 10 Å.

In some embodiments, insulation elements of the memory cell 100 (e.g., insulation material 160) are constructed of silicon dioxide, silicon nitride, and/or any appropriate insulator that can be used to form the insulation elements of nonvolatile memory cells.

Figure 2:
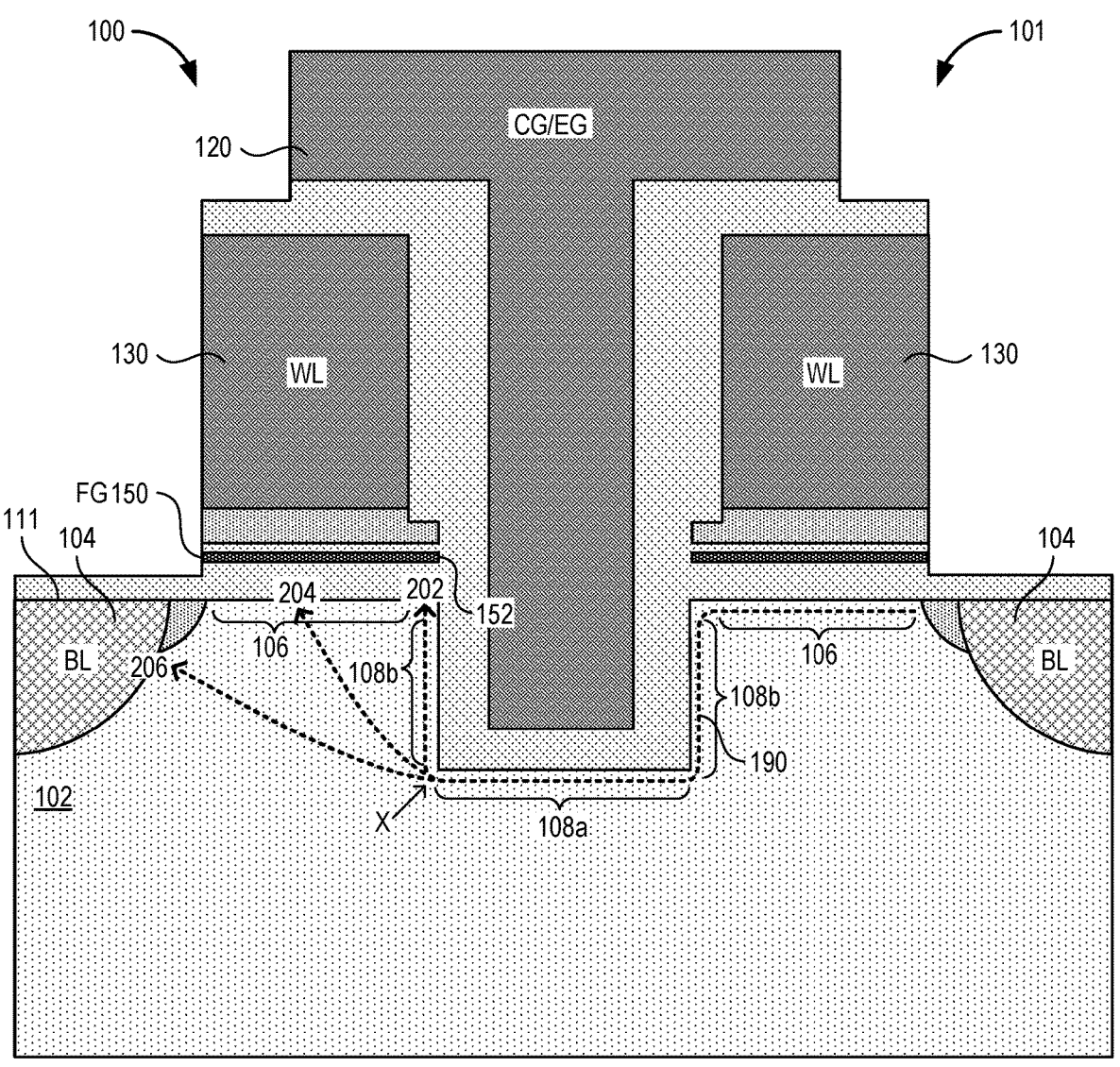
FIG. 2 is a diagram illustrating the effect of competing electric fields on electron flow during a programming operation in accordance with some embodiments.

Attention is now drawn to channel portions of memory cell 100, as illustrated in FIG. 2. These channel portions are in operation during a program operation of the memory cell 100 (described in more detail below). In some embodiments, surface portion 106 of mirror memory cell 101, sidewall portion 108b of the trench region of the mirror memory cell 101, bottom portion 108a of the trench region, and sidewall portion 108b of the trench region of memory cell 100 form a continuous channel 190 extending from bit line region 104 of mirror memory cell 101 to a portion of the substrate located closest to sidewall region 108b of memory cell 100. In some embodiments, neighboring portions of channel 190 are adjacent to each other or overlap with each other, and in some embodiments, surface region 106 of mirror memory cell 101 overlaps with the bit line region 104 of mirror memory cell 101. In other words, portions 106, 108a, and 108b form a continuous channel 190. In some embodiments, the continuous channel region formed by portions 106 (of cell 101), 108b (of cell 101), 108a, and 108b (of cell 100) is non-coplanar, as the sidewall portions 108b of channel 190 extend substantially perpendicular to the lateral direction in which surface portion 106 extends, and the bottom portion 108a of channel 190 extends substantially perpendicular to the direction of the sidewall portions 108b of channel 190. In some embodiments, "substantially perpendicular" means an angle within a range of 75 to 105 degrees.

Operation of the memory cell 100 in accordance with some embodiments will now be described with reference to FIG. 2. The following discussion discloses erase, program, and read operations of memory cell 100. All items described with reference to FIG. 2 refer to items included in memory cell 100, unless explicitly stated as referring to mirror memory cell 101.

To erase memory cell 100 (in an erase operation), a negative high voltage (e.g., approximately −7V (or alternatively, −7V to −8V)) is applied to word line 130, and a positive high voltage (e.g., approximately 6V) to erase gate 120, keeping source/drain (bit line region 104) and substrate 102 at ground. The floating gate 150 is coupled to a negative voltage by capacitive coupling to word line 130, which causes Fowler-Nordheim (F-N) tunneling of electrons injected from the floating gate tip (first end 152, the end pointing toward to the erase gate 120) due to the enhanced field at the floating gate tip (first end 152). As electrons are pulled out, floating gate 150 is charged up positively until the voltage drop between floating gate 150 and erase gate 120 is no longer strong enough to sustain a meaningful F-N tunneling current. As noted above, the capacitive coupling between floating gate 150 and erase gate 120 is very small compared with the capacitive coupling between floating gate 150 and word line 130. Thus, a relatively low high voltage is needed for the erase operation, thereby allowing for efficient erasing (also called erasure or erase) of the memory cell 100.

In some embodiments, during an erase operation, the word lines 130 of both neighboring memory cells 100 and 101 are biased at the same voltage (e.g., approximately −7V (or alternatively, −7V to −8V). With both word lines set to the same voltage, both memory cells 100 and 101 are erased as the same time, as the memory cells along the word line pair is treated as a minimum erase sector.

To program memory cell 100 (in a program operation), electrons are injected to floating gate 150 of memory cell 100 to neutralize the positive charges from an erase operation on the same memory cell, or to make floating gate 150 of memory cell 100 negatively charged. Example voltage bias values for a program operation include approximately 4V to 4.5V on the source/drain (bit line region 104) of memory cell 100, 0V on the source/drain (bit line region 104) of mirror memory cell 101, a positive high voltage (e.g., approximately 6V to 8V) to the word lines 130 of both memory cell 100 and mirror memory cell 101, and 1.6V to 1.8V to the control/erase gate 120. These voltage bias values cause a sub-threshold current (e.g., less than 100 nA) of electrons to flow from bit line region 104 of mirror memory cell 101 to bit line region 104 of memory cell 100 along channel 190. In some embodiments, fixed potentials (i.e., fixed voltages) are applied to the control/erase gate 120 (e.g., 1.8V) and the source/drain (bit line region 104) of memory cell 100 (e.g., 4V), and the source/drain (bit line region 104 of mirror cell 101) is controlled with a signal pulse from 1.8V to ground and then back to 1.8V to perform the program operation.

When electrons flow through bottom trench portion 108a under control/erase gate 120 and turn upward at the transition from the bottom trench portion 108a to the sidewall trench portion (at the corner of the trench labeled with an X in FIG. 2), they are subjected to a strong vertical electric field component that accelerates them upwards toward the substrate surface 111 under floating gate 150. If the electrons gain sufficient energy (e.g., 3.2 eV) to overcome the energy barrier at the substrate and the SiO2 interface at substrate surface 111 underneath floating gate 150, then the electrons cross the surface 111 and are pulled toward floating gate 150 by the attractive Coulomb force. This programming mechanism provides for increased programming speed. The floating gate 150 potential drops as the floating gate gains electrons. This process continues until the floating gate potential is low enough to decrease the vertical field underneath surface portion 106 to prevent the electrons in the channel from gaining sufficient energy in the vertical direction to overcome the energy barrier at the interface (surface 111 underneath floating gate 150).

Thus, during a program operation, a word line potential (as noted above), a control gate potential (as noted above), and a bit line potential (as noted above) are configured to enable electrons to travel underneath the bottom portion 108a of the trench region and up the sidewall portion 108b (of memory cell 100) of the trench region toward the floating gate 150. In some embodiments, floating gate 150 may reach a programmed state in 20 ns or less during such a program operation. Stated another way, in some embodiments, memory cell 100 is configured during a program operation for the floating gate 150 to reach a programmed state in 20 ns or less during the program operation. Additional details regarding the programming process are discussed below.

To read memory cell 100 (in a read operation), 0V is applied to the source/drain (bit line region 104) and word line 130 of memory cell 100, Vdd (e.g., 1.8V) is applied to the source/drain (bit line region 104) of mirror memory cell 101, 3V to 4V (or alternatively, 2.5V to 5 sV) is applied to the control gate 120, and 0V or Vdd (e.g., 1.8V) (i.e., no charge pump needed) is applied to the word line 130 of mirror memory cell 101. These voltage bias values fully turn on the trench bottom portion 108a and trench sidewall portions 108b of channel 190, and with the fully depleted substrate region under the floating gate of the mirror cell 101, the electrons can flow freely from any portion of the trench sidewall 108b toward the bit line region 104 of the mirror cell 101 without much resistance (e.g., in the opposite direction of path 206 in FIG. 2). Stated another way, during the read operation, the portion of the substrate that is on the side of the mirror cell 101 is fully depleted due to the 1.8V applied to the source/drain 104 of mirror cell 101 and a deep halo implant 306 (see FIG. 3, and the discussion FIG. 3, below) in a region adjacent the source/drain (bit line region 104) of mirror cell 101. The mirror cell channel region 190 is fully depleted regardless of the mirror cell's floating gate voltage. If the mirror cell floating gate voltage is positively charged, mirror cell channel region has an inversion layer, but not if the mirror cell floating gate voltage is negatively charged. In either case, the resistance to electron flow in the mirror cell channel region is virtually identical, and impacts the read current flow by less than 3%. Stated another way, the read current is insensitive, within a tolerance of 3%, to the programmed/erase state of a mirror cell.

Thus, in some embodiments, during a read operation of memory cell 100 as discussed above, the only node that requires a charge pump (e.g., to maintain the node at a voltage different from the fixed voltage potentials provided to the integrated circuit in which memory cell 100 resides) is the control/erase gate 120, keeping the power consumption caused by charge pumping to a minimum.

In embodiments that include the trench implant and deep halo implant, but not the corner implant (see discussion of implants, below), if floating gate 150 is sufficiently positively charged (e.g., +1.0V, or alternatively, +1.0V to +2.0V, in an erased state), the field produced by floating gate 150 fully turns on the remaining portion of channel 190 (surface portion 106 of memory cell 100) and a high read current is produced and detected, with the floating gate channel threshold voltage adjusted to be around −1.0V to −1.2V. On the other hand, if floating gate 150 is negatively charged (e.g., in a programmed state, with a potential at approximately −1.0V to −1.5V), the field produced by floating gate 150 is not sufficient to turn on the portion of channel 190 (e.g., surface portion 106 of memory cell 100) between the trench sidewall portion 108b of channel 190 and bit line region 104 of memory cell 100, and the read current will be at the sub-threshold level.

The following discussion describes embodiments including features for high efficiency programming. As noted above, to program floating gate 150 of memory cell 100, electrons flow from the source node (bit line region 104) along the portion of channel 190 located in mirror memory cell 101 (surface portion 106, trench sidewall portion 108b, and trench bottom portion 108a). At the transition from trench bottom portion 108a to trench sidewall portion 108b (of memory cell 100), the trench corner labeled X in FIG. 2, electrons are no longer confined in an inversion layer, and they are set free to face a much stronger electric field. This electric field is in a fully depleted space charge region that pulls the electrons leftward and upward (e.g., in the directions of paths 204 and 206).

To increase programming efficiency, the electrons need to be pulled primarily upward toward floating gate 150 (in the direction of path 202). These programming electrons gain kinetic energy while being accelerated, and if the energy is higher than the energy barrier height at the silicon/oxide interface at surface 111, the electrons will be injected into the floating gate insulation region 164 (FIG. 1) and then pulled to the floating gate 150. At trench corner X, the electrons are affected by pulling forces (e.g., attractive Coulomb force, or electrostatic force, cause by electrical fields) from floating gate 150 of memory cell 100 at the top side (in the direction of paths 202 and 204), from the drain node (bit line region 104) of memory cell 100 (in the direction of path 206), and from the control/erase gate 120 (in the direction of control/erase gate 120).

Thus, if the pulling force from the drain (bit line region 104) is about the same as that from the control gate, electrons flow primarily in the direction of path 202. However, if the pulling force from the drain (bit line region 104)

is stronger than that from the control gate, electrons flow primarily in the direction of path 204 or 206 (depending on how much stronger the pulling force from the drain is compared to that from the control gate). While FIG. 2 depicts three electron paths 202, 204, and 206, these paths are shown as three discrete lines in order to illustrate the examples described herein. In reality, however, one of ordinary skill in the art would appreciate that the paths electrons may take when being pulled from location X is more like a spectrum, and the path itself may change based on the amount of the aforementioned pulling forces as well as the pulling force from the top due to the floating gate potential. The pulling force from the floating gate decreases as the programming mechanism progresses.

If the pulling force from the drain node (bit line region 104) is stronger than that from the control/erase gate 230, then electrons will flow primarily toward path 204 or 206 while moving up, which is not desirable since the horizontal direction of movement of the electrons is less favorable in gaining the energy needed in the vertical direction to be injected into floating gate 150. Stated another way, electrons after passing corner X must have a sufficient vertical component in the direction of flow in order to gain sufficient energy to be injected into the floating gate 150. Therefore, in some embodiments, it is desirable to increase the control gate voltage during program operations to counter the pulling force from the drain (bit line region 104), thereby countering the horizontal component in the direction of flow of the electrons after they pass corner X and ensuring a sufficient vertical component in the direction of flow for electrons to gain sufficient energy to be injected into the floating gate 150.

However, increasing the control gate voltage during program operations while maintaining low programming current would require the control gate threshold to be high, which has a negative impact on the read current. In order to address this trade-off, in some embodiments, memory cells 100 and 101 include (e.g., are configured with) a plurality of implants to optimize the threshold voltage for different portions of channel 190 to accomplish high programming efficiency while maintaining sufficient high read current for the erased cell.

For embodiments in which the word lines 130 from both memory cells in a memory cell pair 100/101 are biased at the same voltage for read operations (e.g., 0V), program operations (e.g., 7V), and erase operations (e.g., −7V), such a mirror cell structure may be implemented as described above with reference to FIGS. 1-2, but with the additional feature of each word line 130 of the memory cell pair being electrically connected together. In these embodiments, a mirror cell structure comprising two memory cells 100/101 may be implemented as a 4-node device, with the nodes consisting of (i) source (e.g., 104 in cell 100/101), (ii) drain (e.g., 104 in cell 101/100), (iii) word line (both word lines 130 electrically connected together), and (iv) control/erase gate 120.

Figure 3:
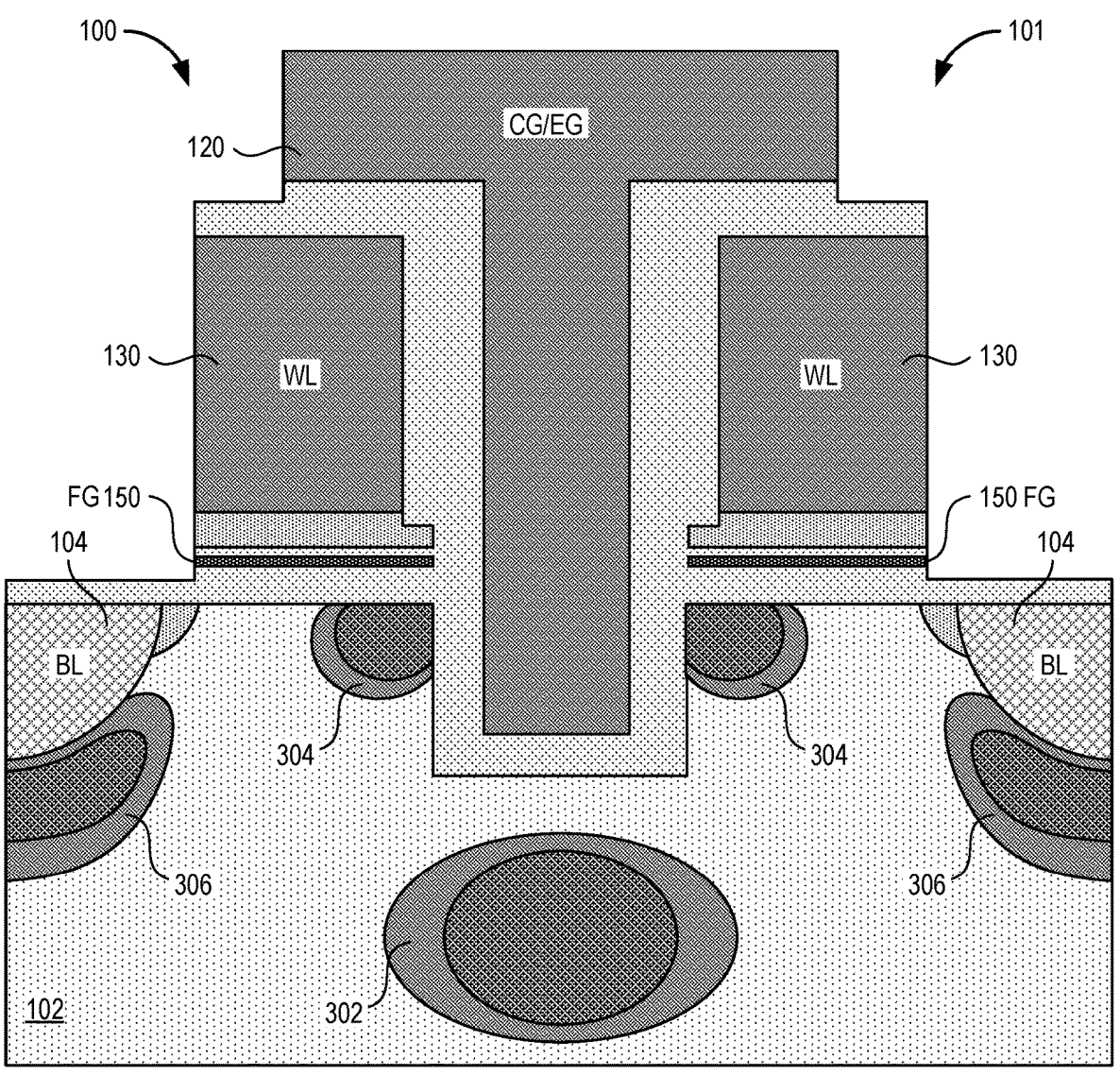
FIGS. 3-5 are diagrams illustrating indium implants, with post-implant annealing and redistribution, in the substrate of a memory cell in accordance with some embodiments.

FIG. 3 illustrates a plurality of implants in substrate 102 of memory cells 100/101 in accordance with some embodiments. In some embodiments, the implants comprise indium (atomic number 49), which is similar to boron and is a p-type dopant, but it is much heavier and diffuses much slower than boron in a silicon substrate in a high temperature environment. In some embodiments, a dopant of the implants described herein is gallium.

Referring to FIG. 3, substrate 102 includes (i) a first indium implant, referred to as a "trench implant" 302, disposed in a region of the substrate below the bottom of the trench; (ii) a second indium implant, referred to as a "corner implant" 304 disposed in regions of the substrate adjacent to the sidewalls of the trench and the surface regions of the substrate for each memory cell 100/101; and (iii) a third indium implant, referred to as a "deep halo implant" 306, disposed in a region of the substrate adjacent to a lower portion (e.g., the bottom) of the source/drain (bit line region 104) of each memory cell 100/101.

In some embodiments, the trench implant 302 increases the threshold voltage of the trench bottom channel (the portion of channel 190 located within trench bottom portion 108a, FIG. 2), such that the channel current is controlled to approximately 100 nA with the control gate 120 voltage Veg at approximately 1.6V to 2.0V during a program operation, to program the memory cell in 10 ns to 20 ns (or less).

In some embodiments that include the corner implant 304, the corner implant 304 for each memory cell 100/101 controls the threshold voltage of the floating gate channel (the portion of channel 190 located in surface region 106, FIG. 2) to be around 0.2V, such that the read current will be below 1 μA for a programmed cell and greater than 10 μA for an erased cell. Thus, the substrate 102 includes a second indium implant (corner implant 304), which causes a threshold voltage of a channel of the floating gate 150 (region 106, FIG. 2) to be approximately 0.2V, causing a read current to be (i) below 1 μA if the floating gate 150 is programmed (e.g., so as to be negatively or neutrally charged), and (ii) greater than 10 μA if the floating gate 150 is erased (e.g., +2.0V positively charged).

In some embodiments, the deep halo implant 306, in combination with the trench implant 302, controls the punch-thru current of unselected rows (control gate 120 voltage Vcg, word line 130 voltage Vwl) to be at 10 pA or lower. The deep halo implant 306 (which preferably does not include a lateral p-type halo between the deep halo implant and the surface of the substrate) provides an additional advantage that, during a read operation of one memory cell 100 or 101, the read current is insensitive, within a tolerance of 3%, to the programmed or erased status of the mirror memory cell 101 or 100. Thus, substrate 102 includes a third indium implant (deep halo implant 306) that, in combination with the trench implant 302, causes a punch-through current of unselected rows to be 10 pA or lower, and furthermore, the difference in read currents of an erased cell 100 with mirror cell 101 being in the erased state or the programmed state is less than 3%. More generally, in some embodiments, the state of mirror cell 101 affects the read current, when reading memory cell 100, by less than 3%, while in some other embodiments, the state of mirror cell 101 affects the read current, when reading memory cell 100, by less than 10% or 15%.

In some embodiments, substrate 102 for neighboring memory cells 100/101 only includes two of the three types of implants discussed above, as illustrated in FIGS. 4-5.

Figure 4:
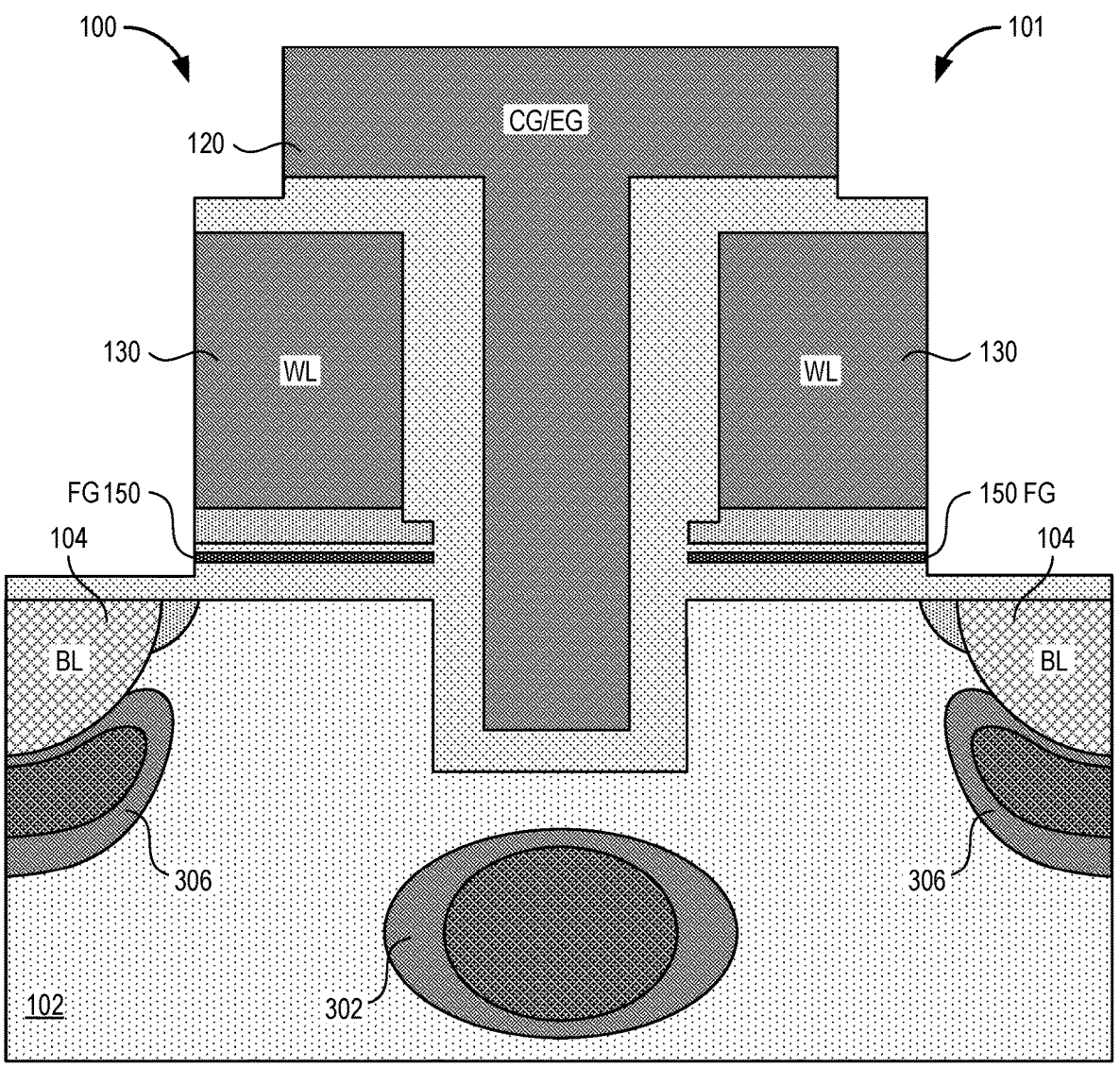
Figure 6:
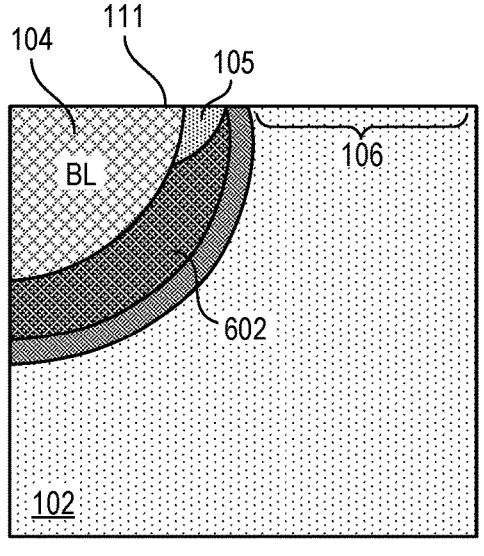
FIGS. 6-7 are diagrams illustrating halo implants in the substrate of a memory cell in accordance with some embodiments.

For example, as shown in FIG. 4, in some embodiments, substrate 102 includes trench implant 302 and halo implants 306, or halo implants similar to the implant 602 shown in FIG. 6, but does not include corner implants. In some such embodiments, during a read operation on memory cell 100, a voltage of 3V to 4V is applied to the word line of the mirror cell 101 to reduce or minimize read current sensitivity to the programmed/erased state of the mirror cell 101.

Figure 5:
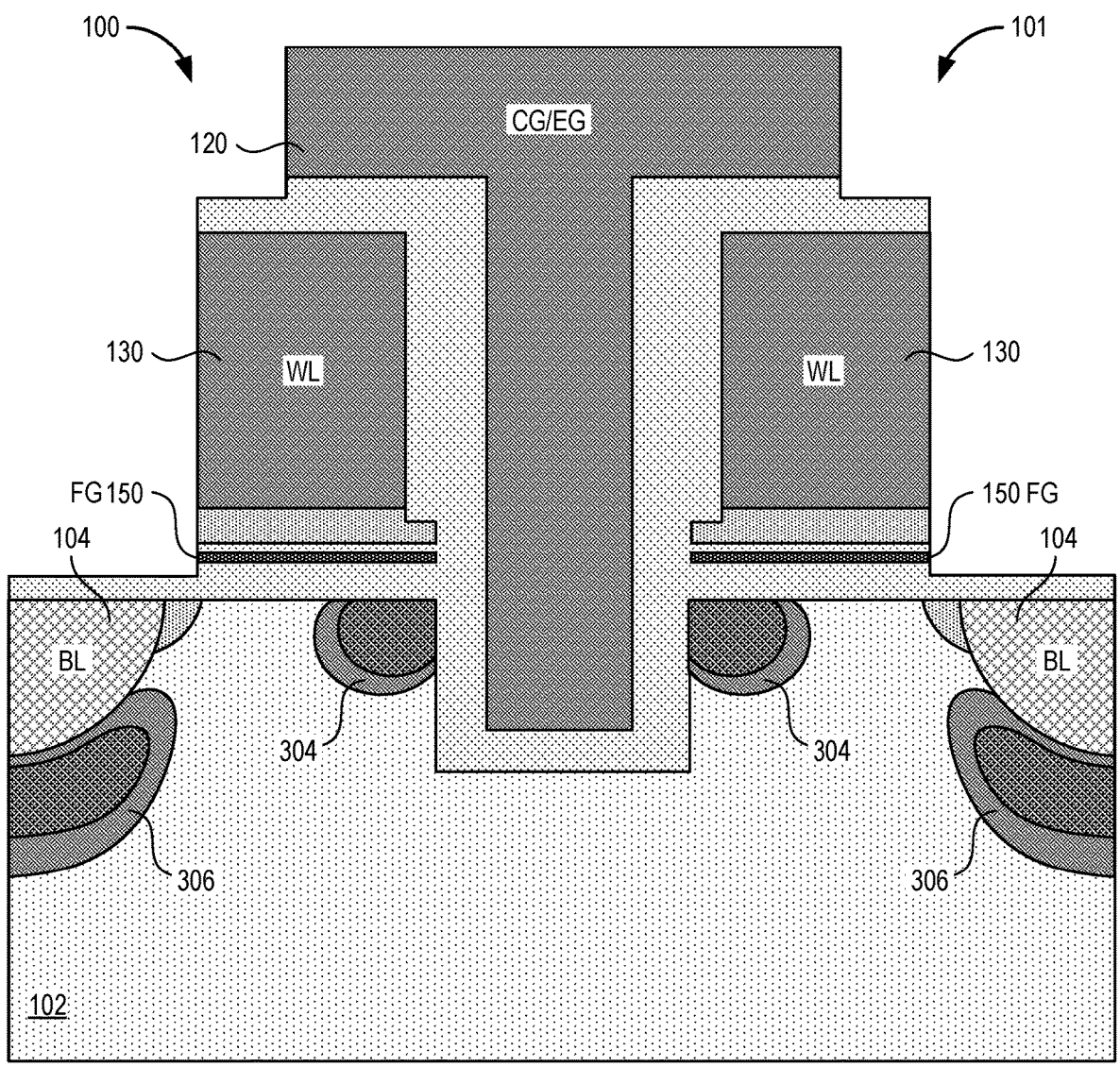

In another example, in some embodiments, substrate 102 includes corner implants 304 and deep halo implants 306, but does not include a trench implant, as depicted in FIG. 5.

Figure 7:
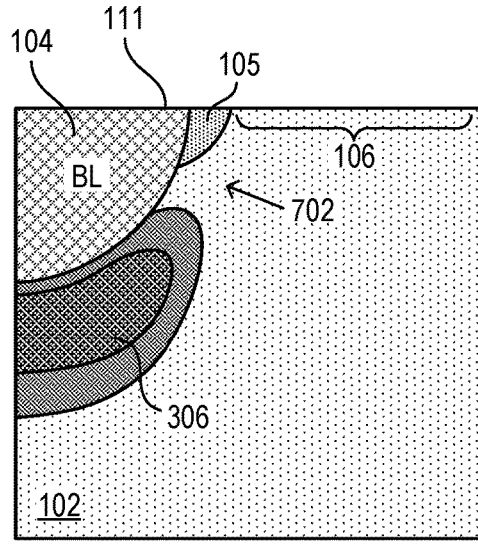

FIGS. 6-7 are diagrams illustrating halo implants in the substrate of a memory cell 100/101 in accordance with some embodiments.

A traditional halo implant 602 (FIG. 6) is disposed about bit line region 104 (source/drain node), from below region 104 all the way up to surface 111 of the substrate 102. For such an implant, during a read operation, with the source/drain node (region 104) of mirror cell 101 at 1.8V, channel region 106 of mirror cell 101 is partially depleted due to the source/drain voltage, and the read current when reading memory cell 100 is more sensitive to the program/erase state of the mirror cell 101 than in the memory cells described above with reference to FIGS. 1-5 (e.g., the read current when reading cell 100 may vary by as much as 25%, or even more, depending on the state of the mirror cell 101).

A deep halo implant 306 (FIG. 7) is disposed about only a lower portion of bit line region 104 (source/drain node), not between the lower portion and surface 111 of the substrate 102 (not in area 702 of the substrate). For such an implant, during a read operation, with the source/drain node (region 104 of mirror memory cell 101) at 1.8V, channel region 106 of mirror memory cell 101 is fully depleted, independent of the floating gate voltage of the floating gate of mirror memory cell 101. The deep halo implant 306 has no meaningful impact on the doping profile of the channel region 106 (i.e., at the interface between the substrate and the source/drain), where "no meaningful impact" is defined, in this context, as not preventing the depletion region in the mirror cell 101 from reaching to the trench sidewall portion 108b of channel 190, which allows electrons to flow with little resistance from the trench sidewall portion 108b in the mirror cell 101 toward the source/drain (bit line region 104) of the mirror cell 101, when a read voltage is applied to the source/drain (bit line region 104) of the mirror cell 101.

Plan View of Memory Array

Figure 8:
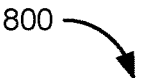
FIGS. 8-9 are diagrams illustrating alternative plan views of a memory cell array in accordance with some embodiments.
Figure 9:

Attention is now directed to FIGS. 8 and 9, which illustrates alternative plan views of memory cell arrays 800 and 900, respectively, in accordance with some embodiments. In some embodiments, bit lines interconnect with drain/source regions of paired memory cells.

Manufacturing Process

Attention is now directed to FIGS. 10A-10F, which illustrate a process for manufacturing a memory cell 100/101 in accordance with some embodiments.

Figure 10A:
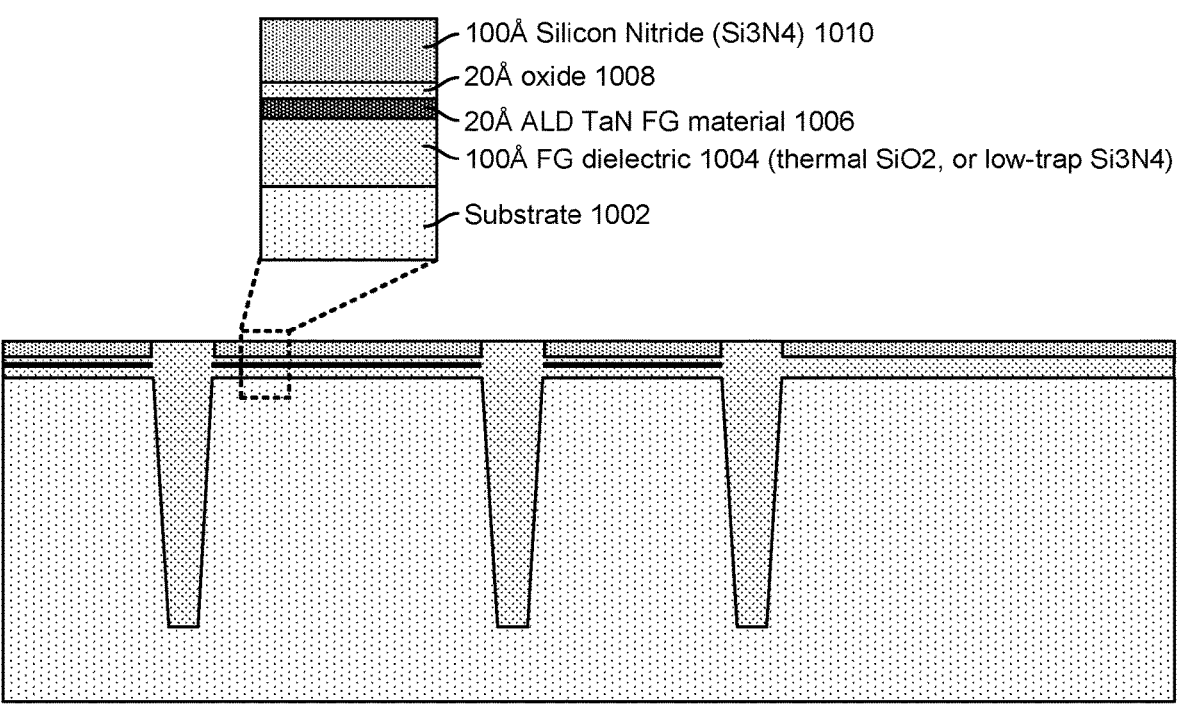
FIGS. 10A-10F illustrate a process for manufacturing an array of electrically erasable programmable nonvolatile memory cells in accordance with some embodiments.

A process in accordance with some embodiments begins in FIG. 10A, which shows a cross-section view of silicon substrate 1002, a dielectric layer 1004 (e.g., thermal silicon dioxide or low-trap silicon nitride), tantalum nitride floating gate material 1006, an oxide layer 1008, and a silicon nitride layer 1010. A number of N- or P-wells are formed, including the stripping of all oxide. The floating gate dielectric layer 1004 is formed (e.g., thermal SiO2, or low-trap Si3N4) (e.g., approximately 100 Å, or alternatively, greater than 100 Å) on the substrate 1002. Then, the floating gate material 1006 TaN (Tantalum Nitride) (e.g., 20 Å or thinner) is deposited. Then, the oxide layer 1008 (e.g., approximately 20 Å or thinner) and the silicon nitride layer 1010 (e.g., 100 Å) are deposited. Then, an STI (shallow trench insulation) mask is placed for STI formation (including the CMP, stopping on the silicon nitride layer).

Figure 10B:
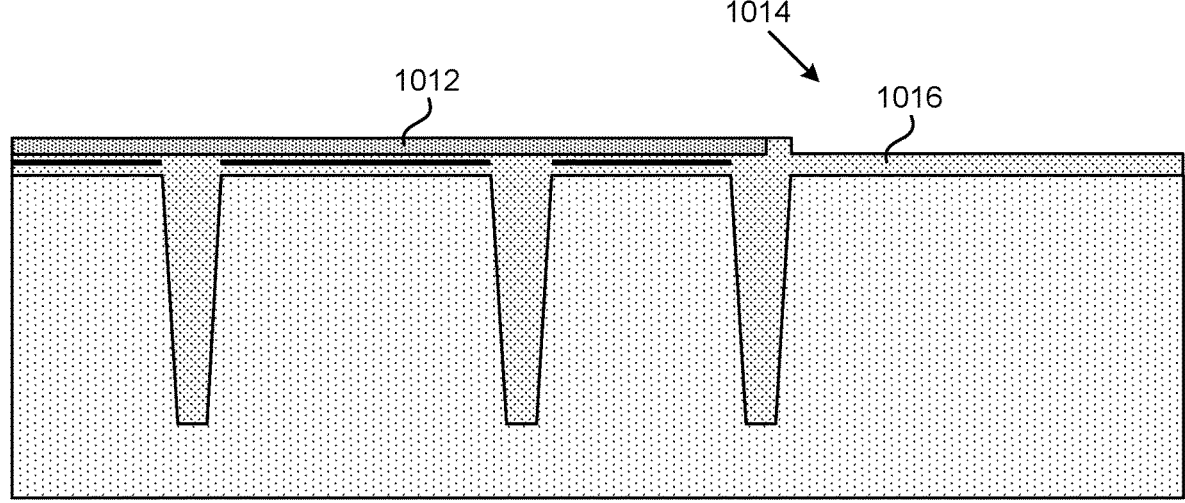

As shown in FIG. 10B, the nitride layer 1010 is stripped, and a high quality Si3N4 thin film 1012 (~80 Å) is redeposited as the coupling dielectric between the Word Line and the TaN Floating Gate. A cell array protection mask is applied to protect the memory cell array areas and remove the nitride/oxide/TaN/oxide stack from other areas (e.g., no-cell areas 1014). Then, HV gate oxide and LV thin gate oxide 1016 are grown in the no-cell areas, with a masking operation to define the thin oxide areas.

Figure 10C:
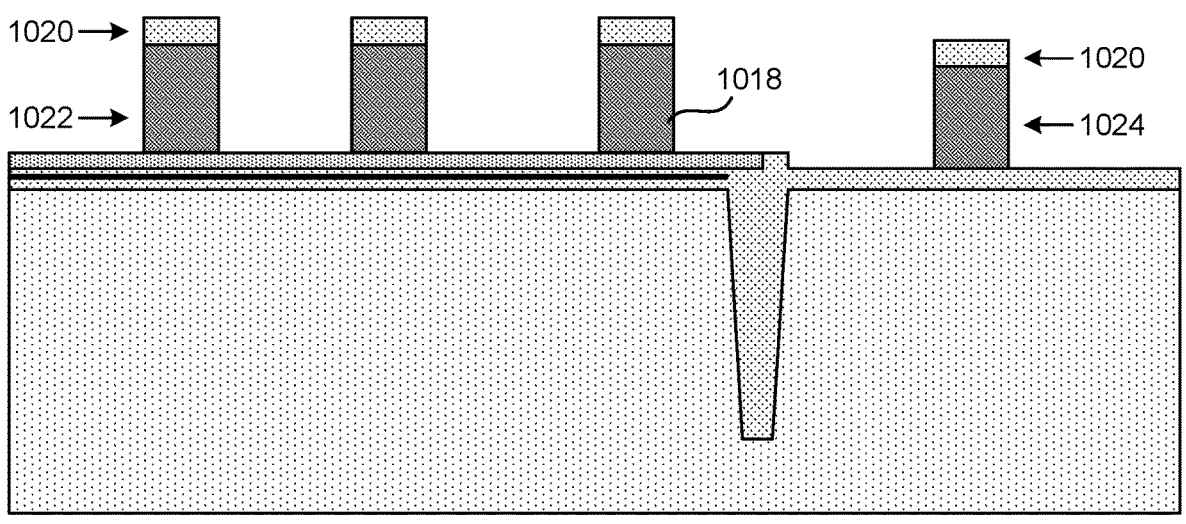

As shown in FIG. 10C, polysilicon gate material 1018 is deposited with proper doping. Then, a gate mask 1020 is applied in a masking operation to define the word line 1022 and peripheral transistor gates 1024.

Figure 10D:
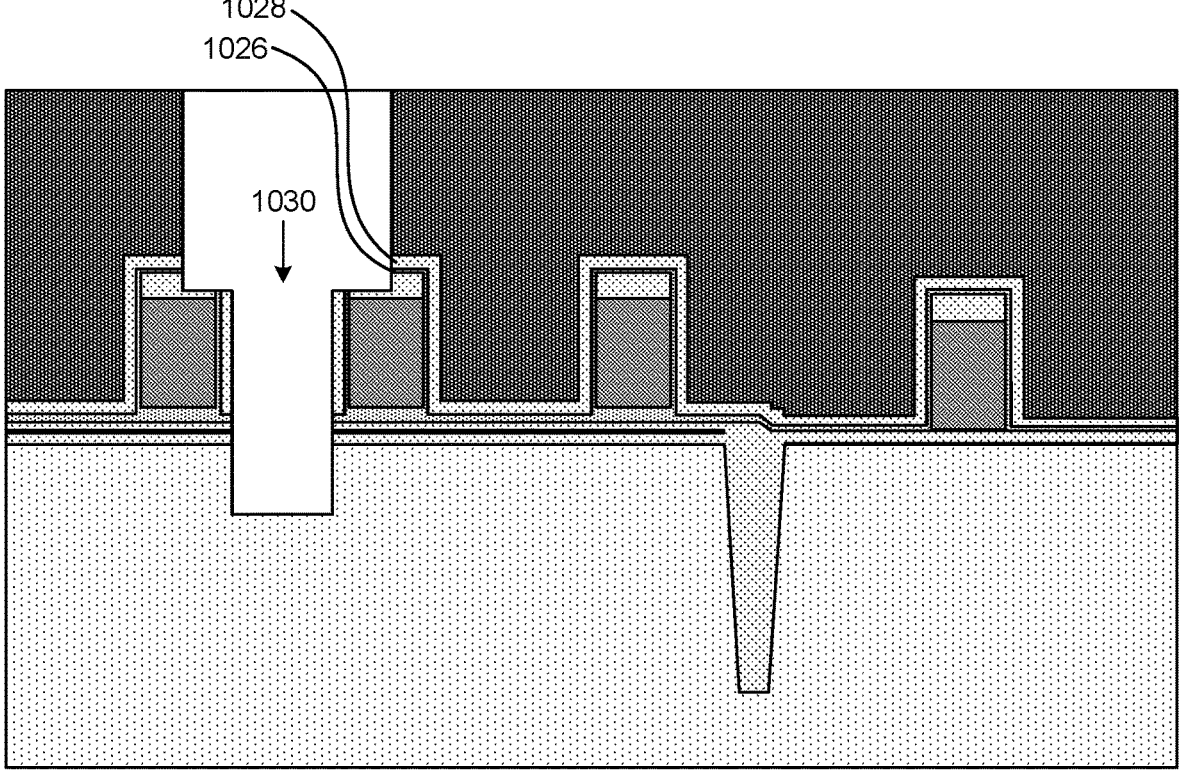

As shown in FIG. 10D, a layer 1026 (e.g., ~20 Å to 30 Å) of Si3N4 is deposited, and a layer 1028 (e.g., 80 Å) of SiO2 is deposited. A trench mask operation is performed in order to form the trench 1030 in the control/erase gate area.

In some embodiments, a corner implant is performed before the trench etch to dope the trench corners with p-type dopant.

Figure 10E:
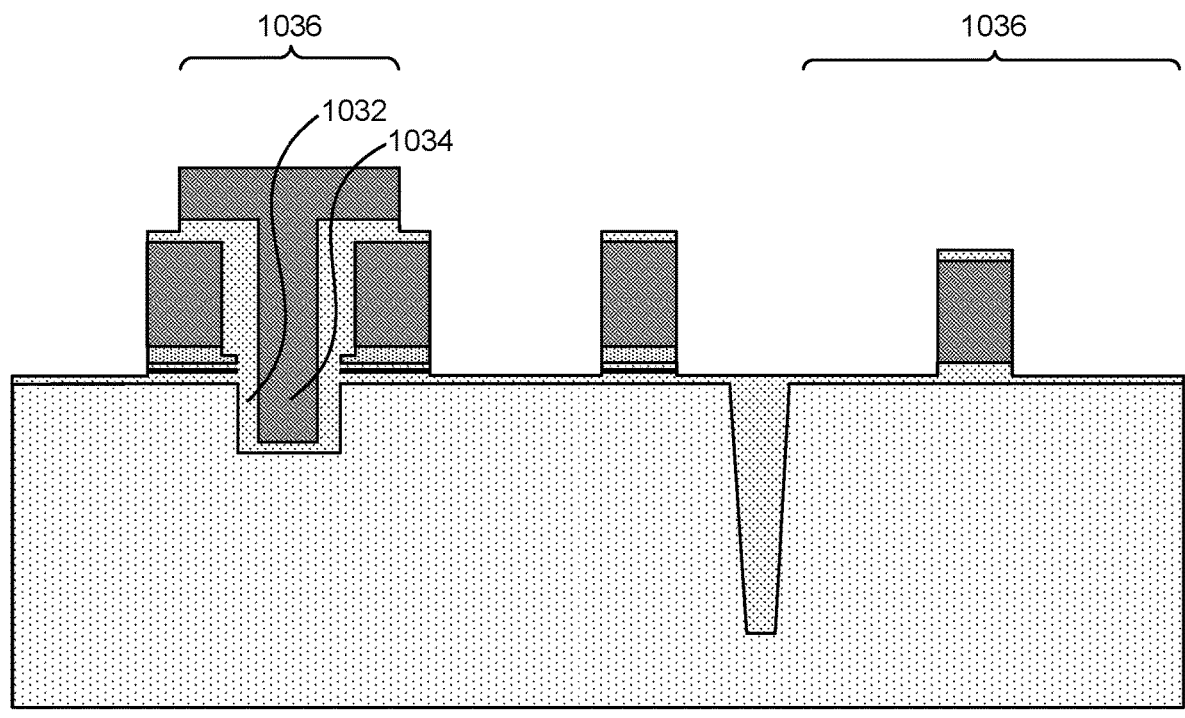

As shown in FIG. 10E, a strip photo resist operation is performed. Then, a high temperature oxide (HTO) layer 1032 (e.g., 120 Å to 150 Å) is added, or a low-trap Si3N4 layer, as a tunnel dielectric. Then, doped polysilicon 1034 is deposited to fill the trench area between word lines, and then the doped polysilicon is partially etched back. Then, a source/drain TaN removal mask is placed at locations 1036 in order to protect the trench area and the peripheral area, to remove the remaining polysilicon, the tunnel dielectric and TaN in the memory cell array source/drain areas. Then, a no-cell area oxide removal mask is placed in order to protect the memory cell array area, to remove the remaining poly-silicon, the tunnel dielectric, and the oxide in the no-cell areas.

Figure 10F:
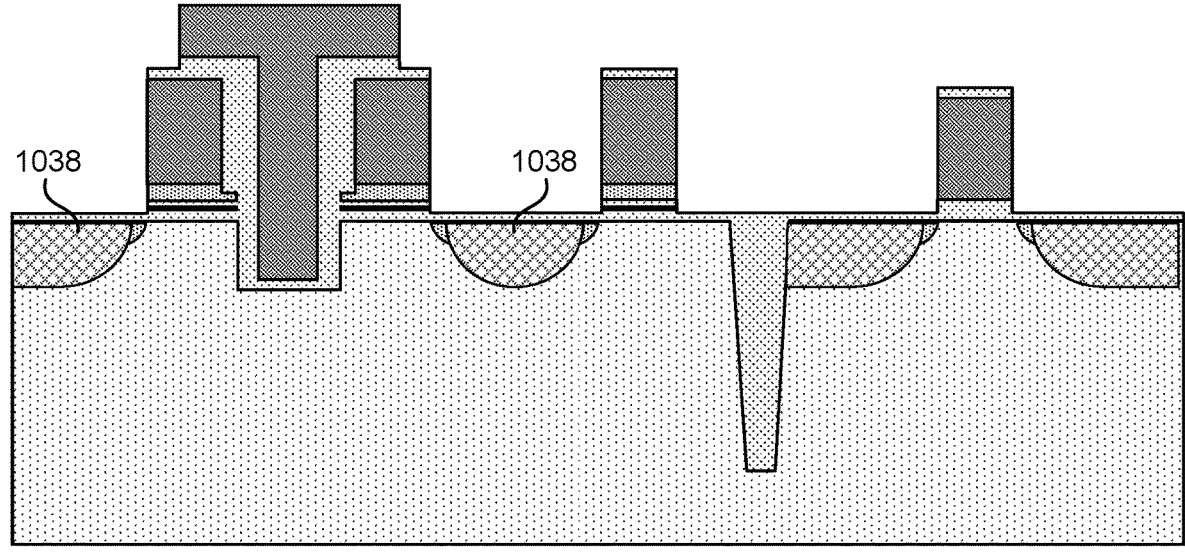

As shown in FIG. 10F, the source/drain regions 1038 are formed using typical backend source/drain forming processes.

Manufacturing Process

Attention is now directed to FIGS. 11A-11M, which illustrate a process for manufacturing a memory cell 100/101 in accordance with some embodiments.

Figure 11A:
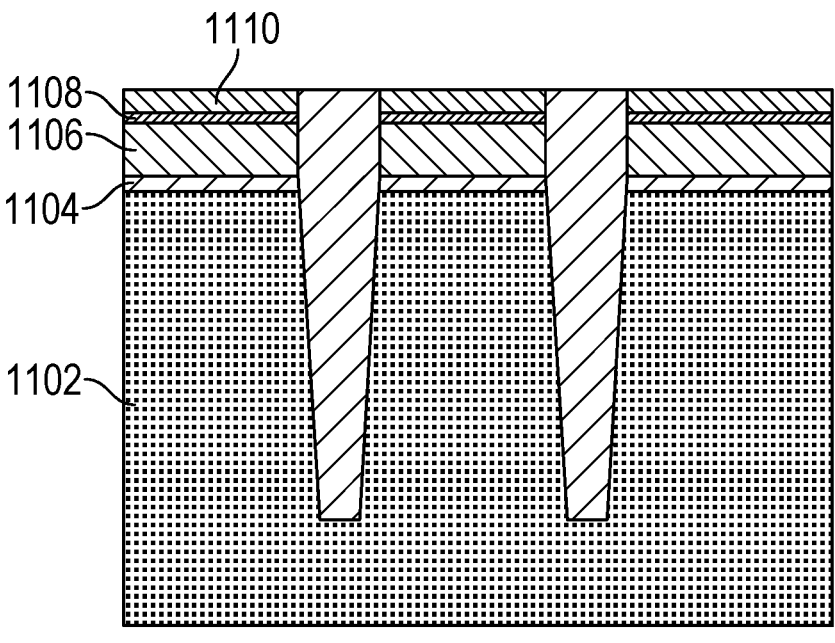
FIGS. 11A-11M illustrate a process for manufacturing an array of electrically erasable programmable nonvolatile memory cells in accordance with some embodiments.

A process in accordance with some embodiments begins in FIG. 11A, which shows a cross-section view of silicon substrate 1102, a dielectric layer 1104 (e.g., thermal silicon dioxide or low-trap silicon nitride), floating gate material 1106, an oxide layer 1108, and a silicon nitride layer 1110. A number of wells are formed, including N-wells, deep N-wells, and P-wells (for the peripheral areas), including the stripping of all oxide. The floating gate dielectric layer 1104 is formed (e.g., thermal SiO2, or low-trap Si3N4) (e.g., approximately 100 Å or thicker) on the substrate 1102. Then, peripheral HV oxide (e.g., 135 Å to 160 Å) and thin oxide (e.g., 32 Å or thinner) areas are formed (not shown). Then, polysilicon floating gate material 1106 (~300 Å, N-type doped (Poly 1)) is formed, and the oxide layer 1108 (e.g., approximately 20 Å) and sacrificial silicon nitride layer 1110 (e.g., Si3N4, 100 Å) are deposited. Then, an STI mask is placed for STI formation (including the CMP, stopping on the silicon nitride layer).

Figure 11B:
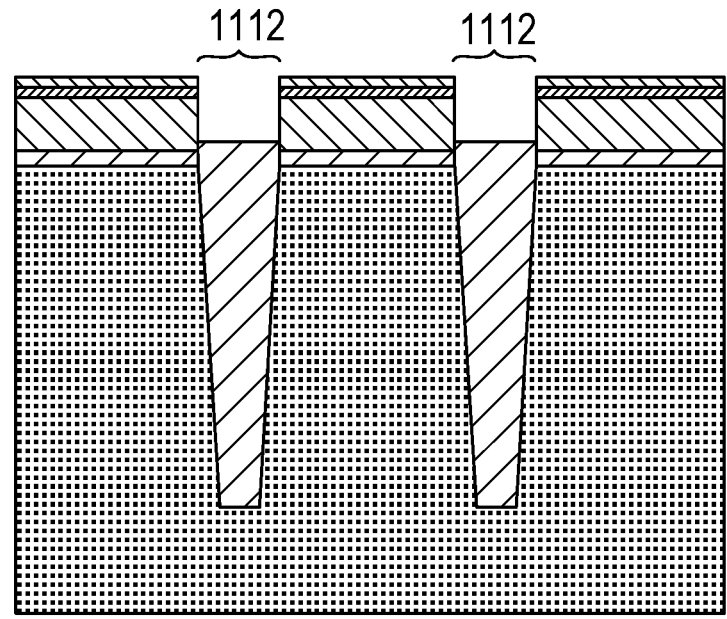

As shown in FIG. 11B, portions of the oxide (above the substrate) in the STI are removed by anisotropic etch.

Figure 11C:
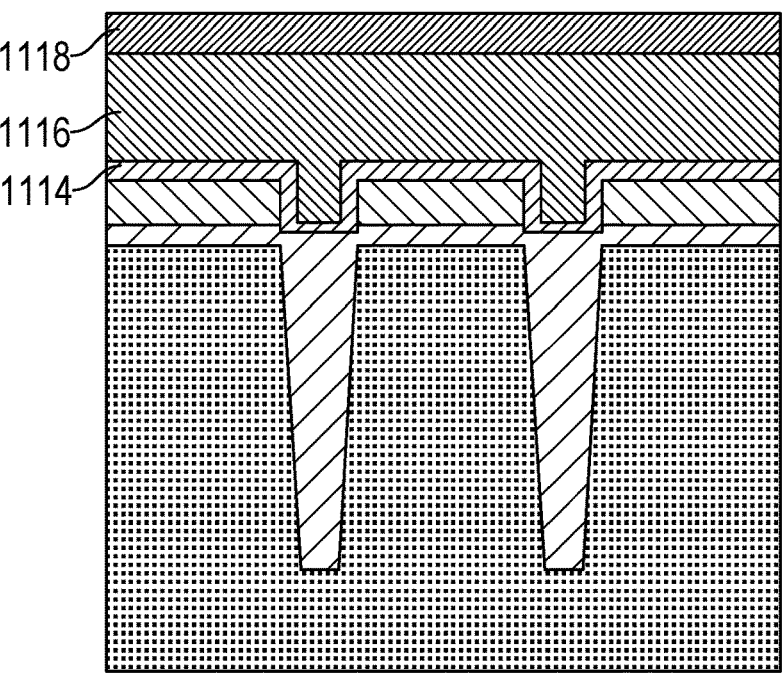

As shown in FIG. 11C, the remaining silicon nitride is removed, and a layer 1114 of high quality 100 Å silicon nitride, or a combination of oxide and silicon nitride, is redeposited as the coupling dielectric material between word lines and floating gates. Then, a cell array protection mask is placed to protect the memory cell array areas and remove the nitride/oxide from other areas (no-cell areas). Then, N-type doped polysilicon (Poly 2) 1116 is deposited, which will become the word line material in the cell array and the gate material (Poly 2 and Poly 1 are connected together) for the peripheral transistors. Then, oxide 1118 is deposited.

Figure 11D:
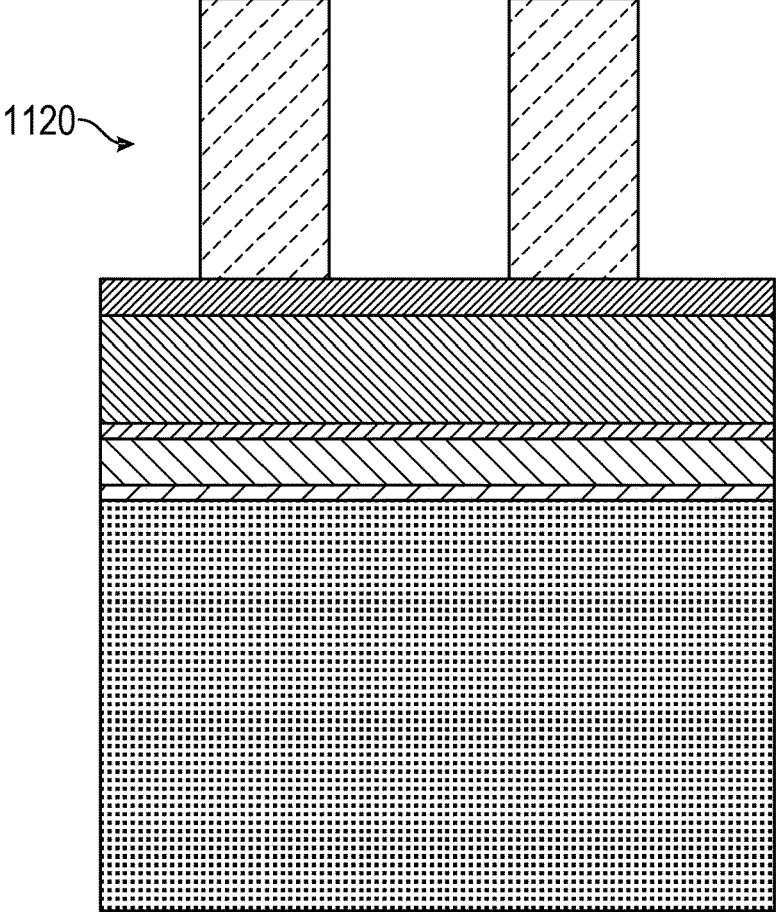

As shown in FIG. 11D, a gate mask 1120 is placed to define the word lines and word line pick-up areas in the cell array and the gate for the peripheral transistors (not shown).

Figure 11E:
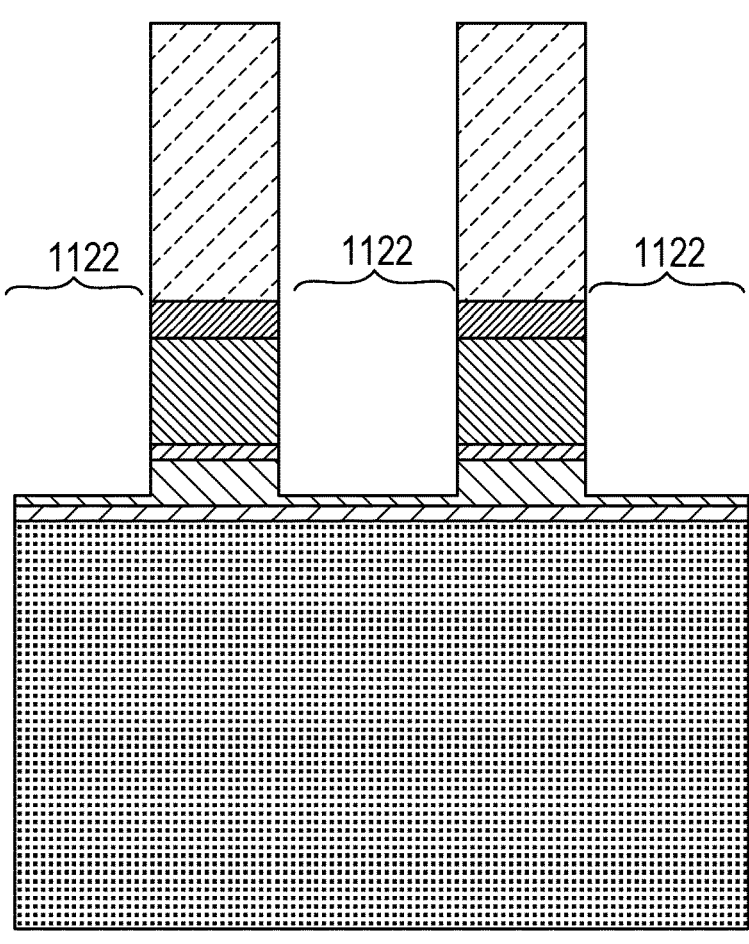

As shown in FIG. 11E, anisotropic etching is performed to remove the oxide/poly 2/nitride stack and the Poly 1 partially with approximately 100 Å remaining (in areas 1122). Then, the photo resist is stripped.

Figure 11F:
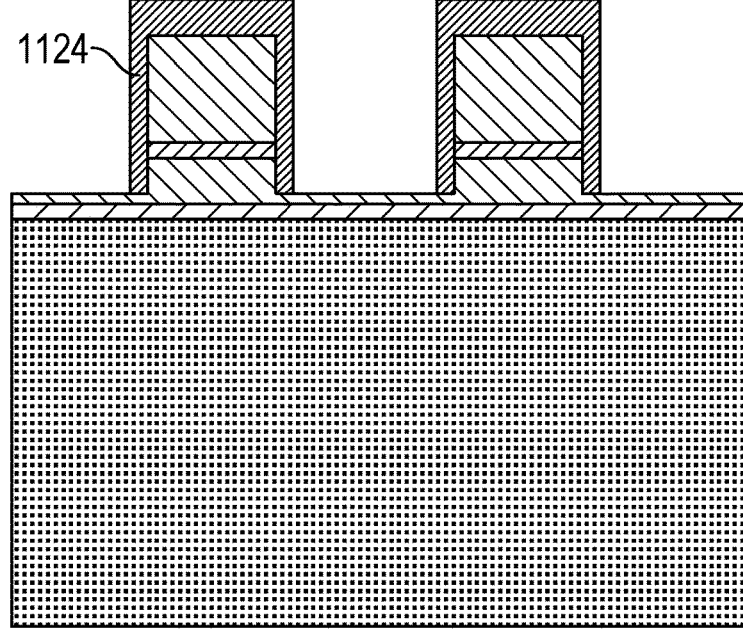

As shown in FIG. 11F, a high quality 130 Å HTO layer 1124 is deposited, followed by anisotropic etching to remove the 130 Å HTO on top of the remaining 100 Å Poly 1.

Figure 11G:
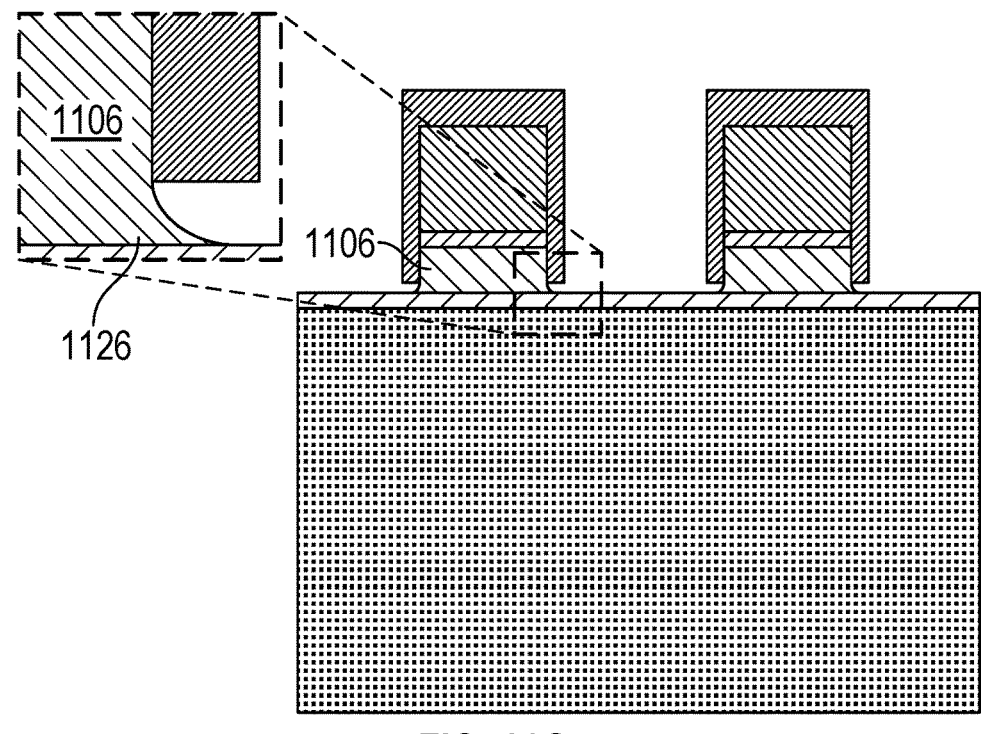

As shown in FIG. 11G, the polysilicon (Poly 1) 1106 is subjected to isotropic etching with an appropriate over-etch to create a sharp Poly 1 edge 1126 (also referred to as a tip, a sharp tip, or a pointed tip) that will serve as the tunneling injector. While the tantalum floating gate described above with reference to FIGS. 10A-10F may have a thickness of 10 Å to 20 Å, the Poly 1 floating gate 1106 may have a thickness of 300 Å to 400 Å, with a tip 1126 having a thickness of less than 30 Å, typically 10 Å to 20 Å.

Figure 11H:
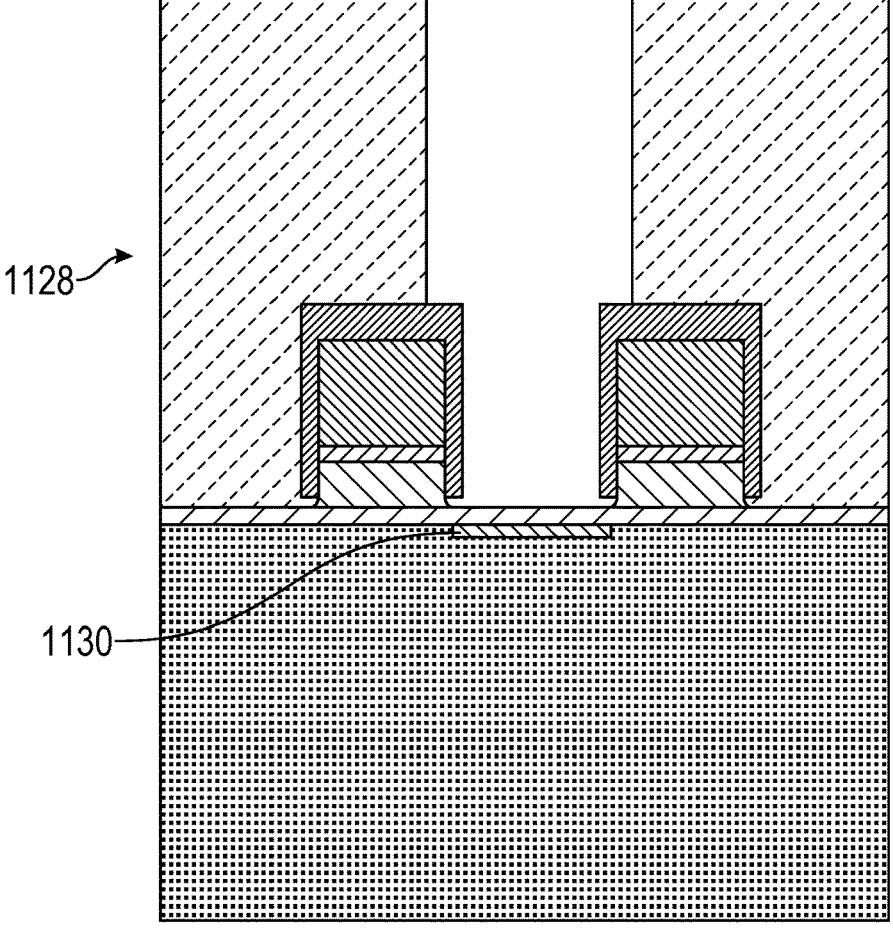

As shown in FIG. 11H, a trench mask 1128 is placed, and a corner implant 1130 is applied to define the threshold voltage of the floating gate channel (e.g., an indium implant, 7 degree angle along the word line direction, with the straggled portion of the implanted indium impurities to dope the trench corners). The corner implant 1130 corresponds to corner implants 304 in FIG. 3.

Figures 11I, 11J:
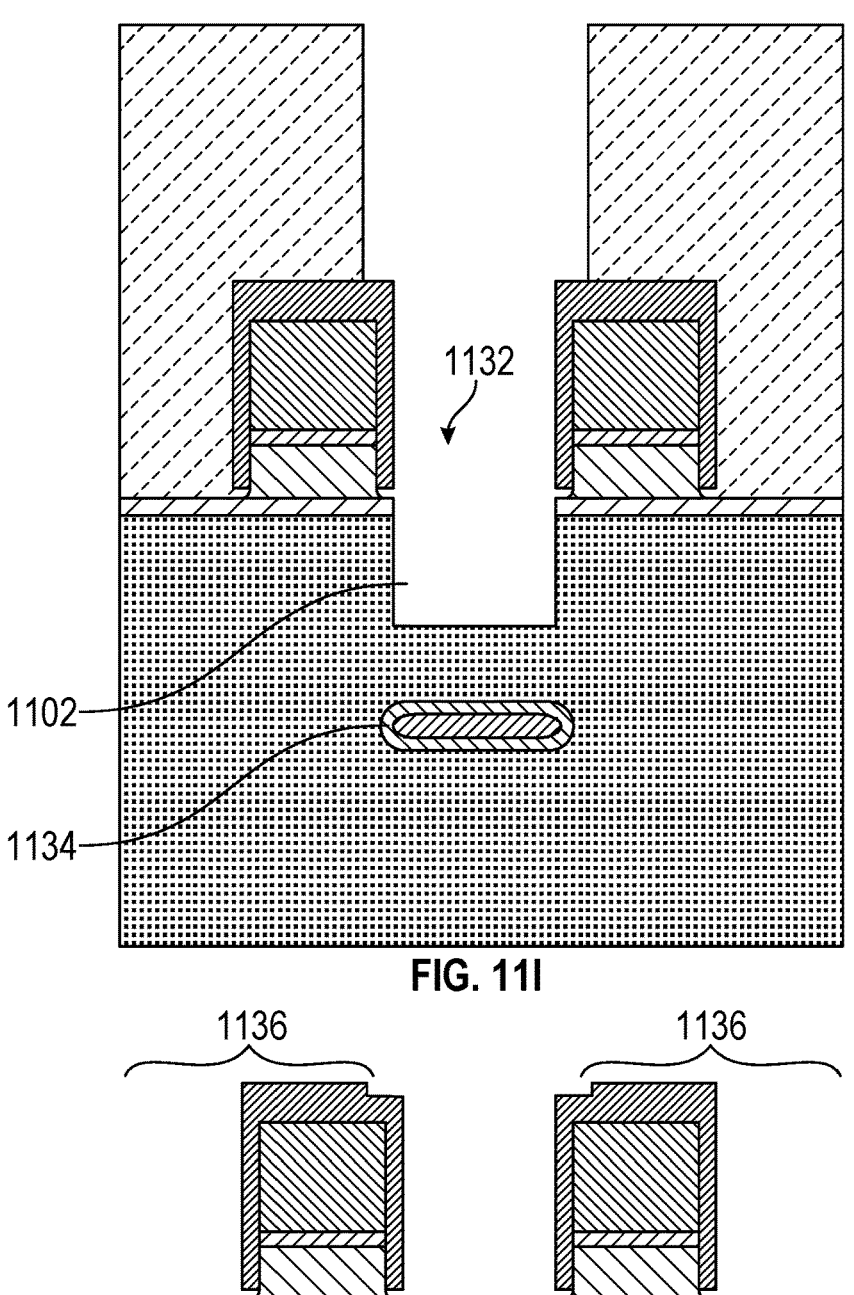

As shown in FIG. 11I, a portion of the substrate silicon 1102 is subjected to an anisotropic etch to produce a ~400 Å trench 1132. Then, trench implant 1134 (e.g., indium 80 Kev, 7 degree tilt along the word line direction) is applied. The trench implant 1134 corresponds to trench implant 302 in FIG. 3.

As shown in FIG. 11J, the photo resist is stripped from areas 1136.

Figure 11K:
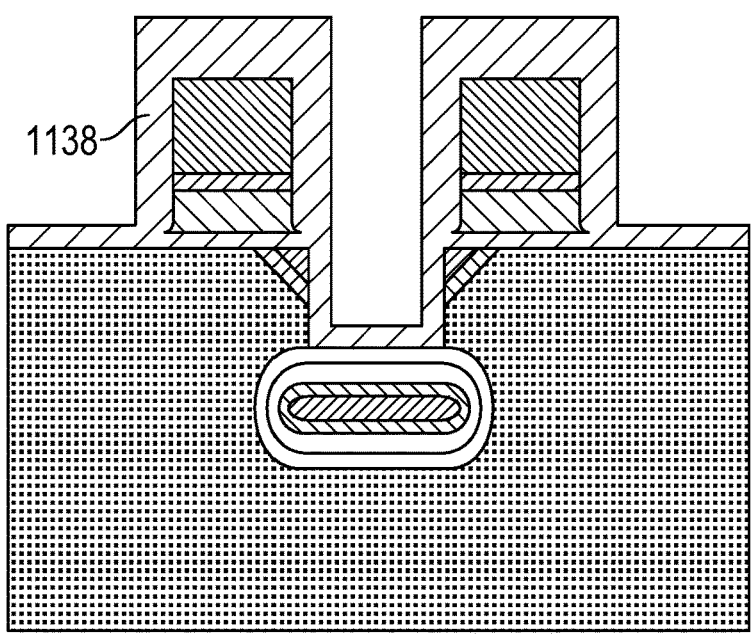

As shown in FIG. 11K, an HTO layer 1138 (e.g., 120 Å) is deposited as the tunnel dielectric material between the floating gate and control/erase gate.

Figure 11L:
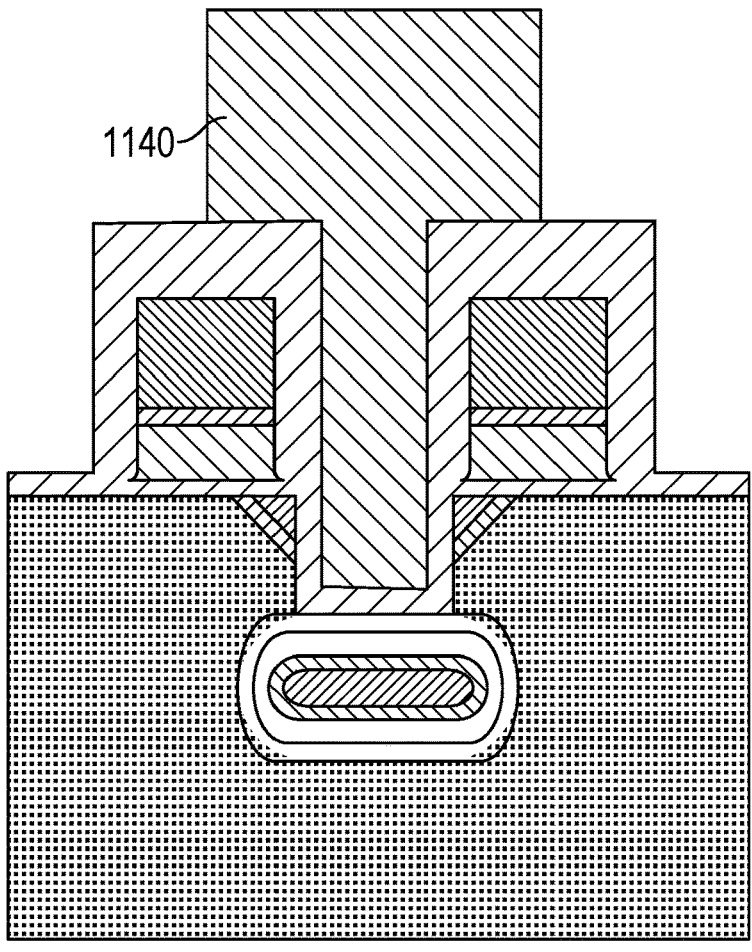

As shown in FIG. 11L, doped polysilicon (Poly 3) 1140 is deposited as the control/erase gate material, using a control/erase gate mask to define the erase gate.

Figure 11M:
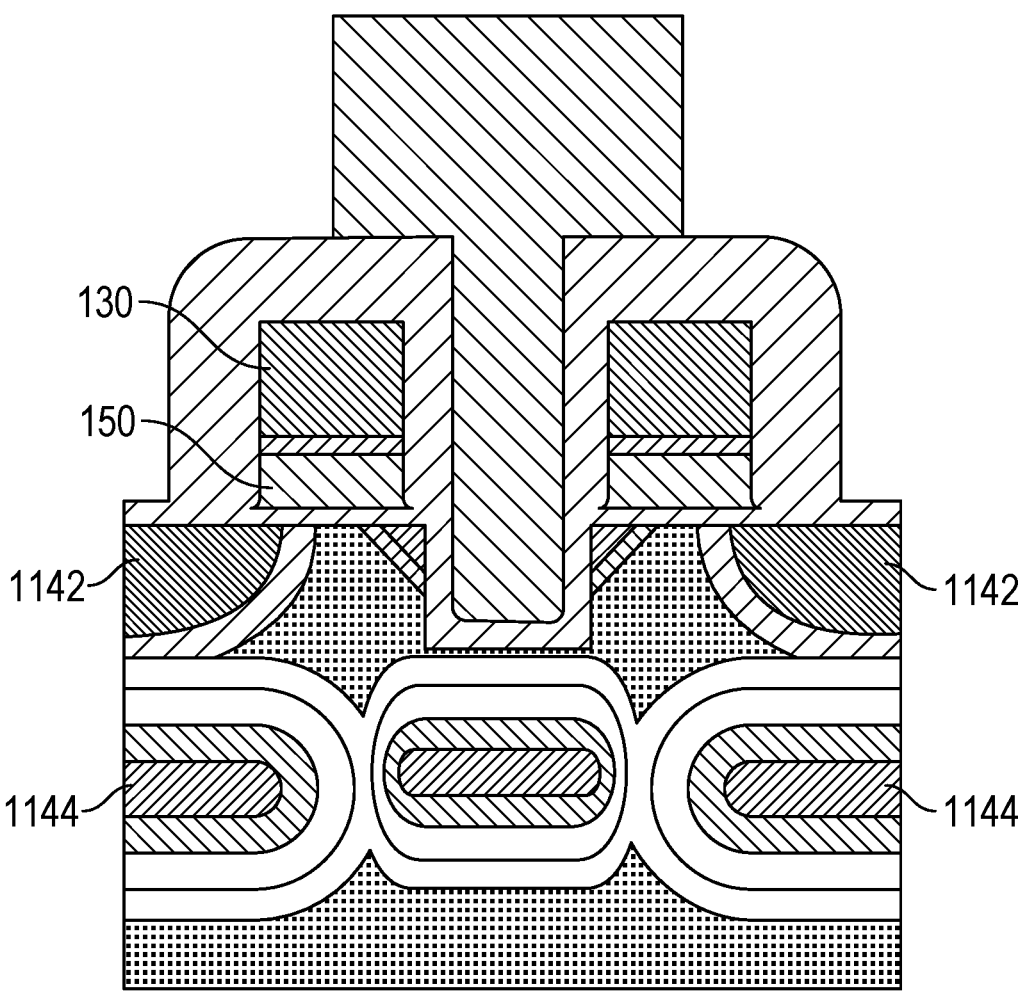

As shown in FIG. 11M, the source/drain regions 1142 are formed. In some embodiments, in the formation process for the source/drain regions 1142, there are no traditional halo implants with lateral halos in the memory cell array area. Instead, indium punch-through suppression (deep halo) implants 1144 is applied. The deep halo implants 1144 correspond to the deep halo implants 306 in FIG. 3.

In some embodiments, the steps for applying the implants 1130 (FIG. 11H), 1134 (FIG. 11I), and 1144 (FIG. 11M) apply to the process flow in FIGS. 10A-10F in a similar way.

As shown in FIG. 11M, the shape of the floating gate 150 is defined by shallow trench isolation (STI) on one side, and the word line 130 on the other side, so no separate mask is involved in forming the floating gate 150.

Second Manufacturing Process

Figures 12A, 12B, 12C, 12D:
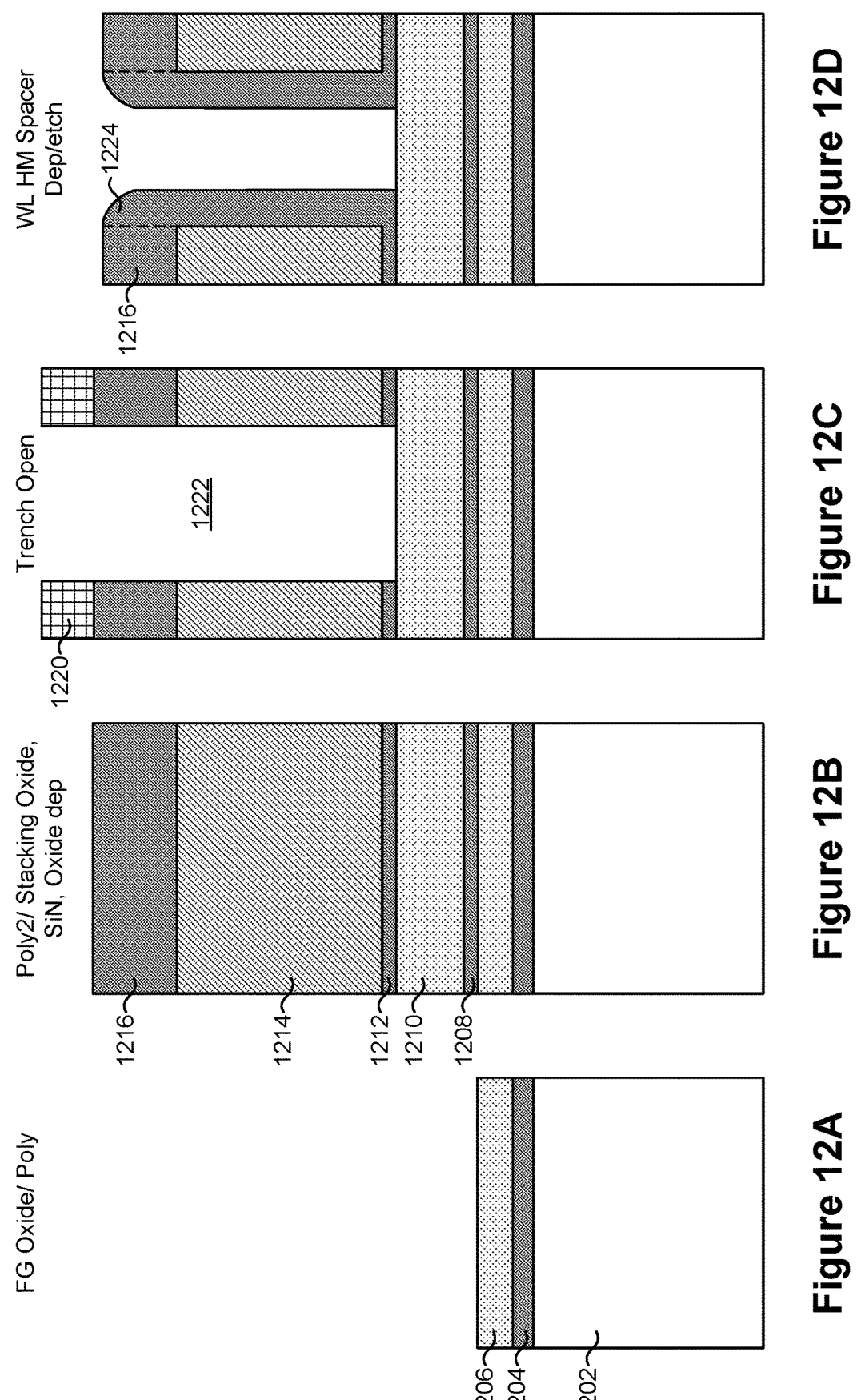
FIGS. 12A-12V and 12W illustrate a process for manufacturing an array of electrically erasable programmable nonvolatile memory cells, each having a polysilicon floating gate, in accordance with some embodiments, and a block diagram of a resulting pair of memory cells.
Figures 12E, 12F, 12G, 12H:
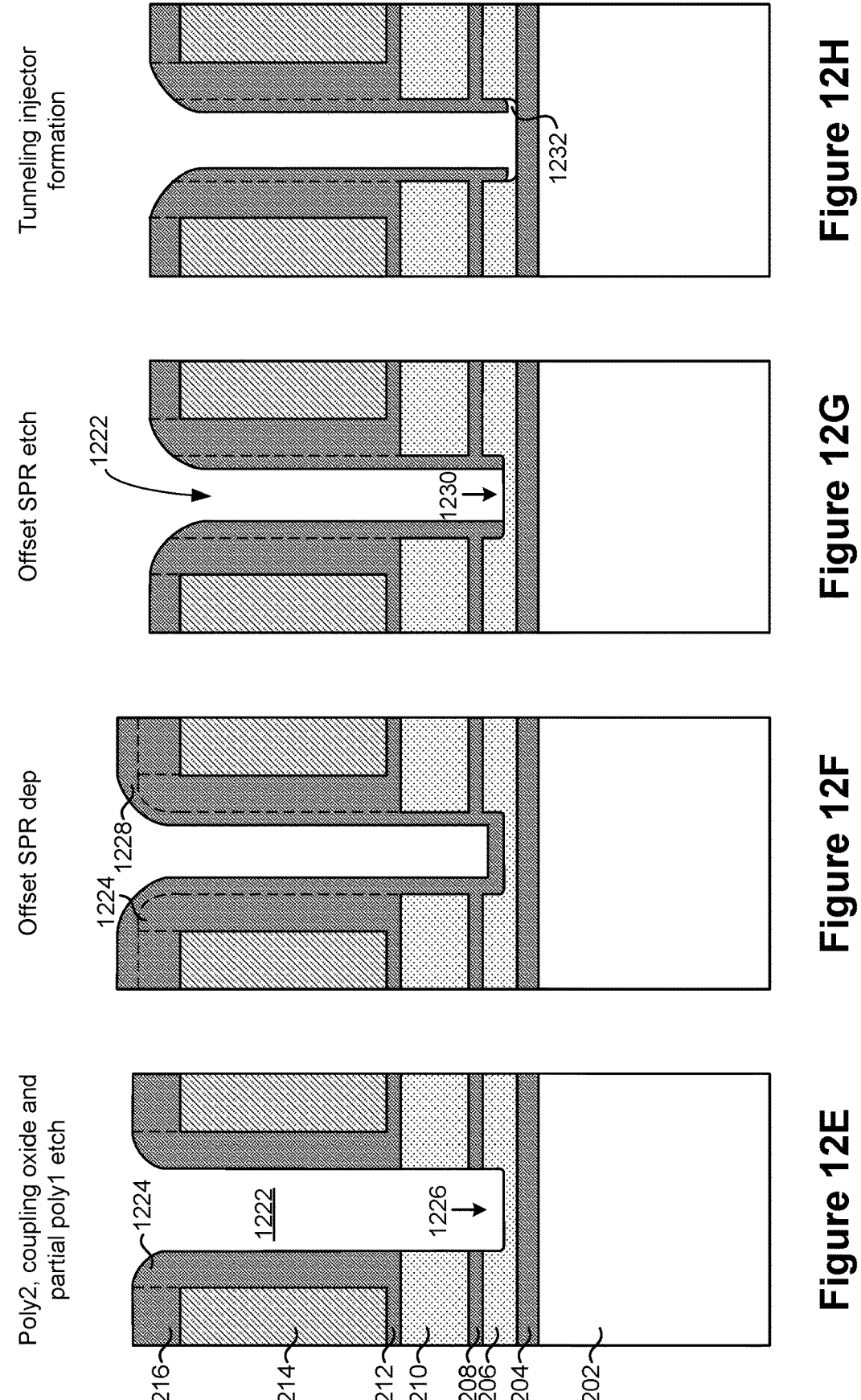
Figures 12I, 12J, 12K, 12L:
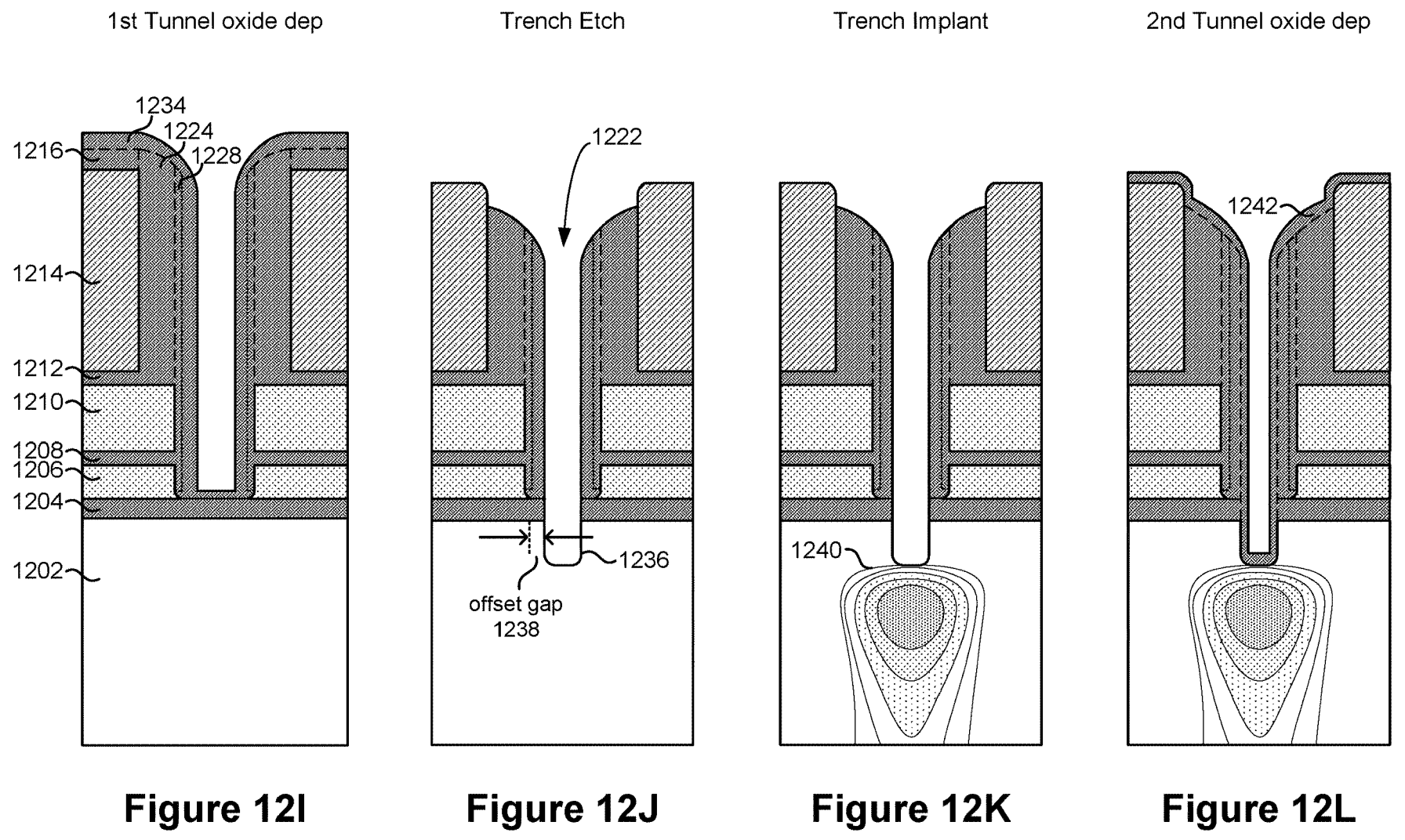
Figures 12M, 12N, 12O, 12P:
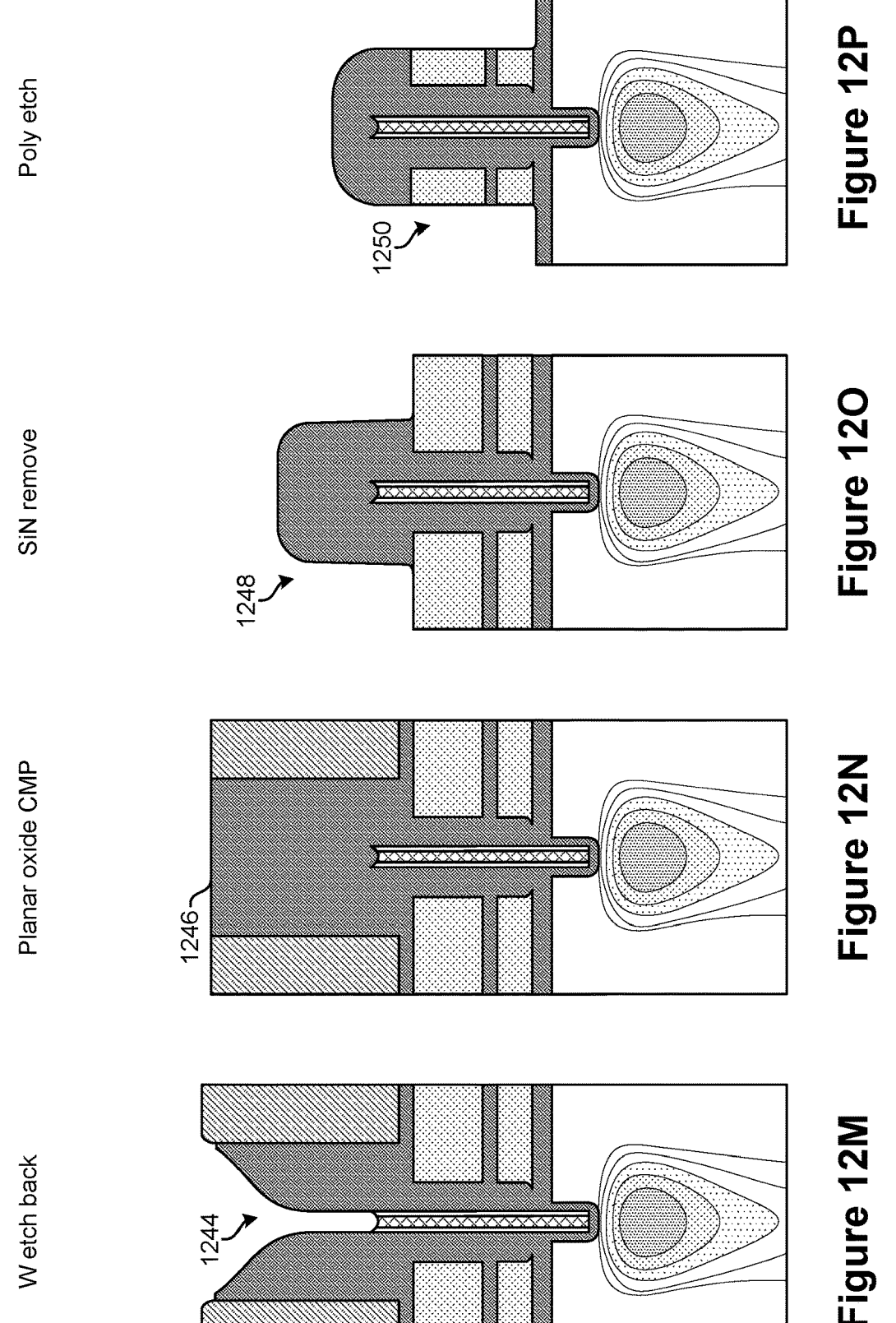
Figure 12T:
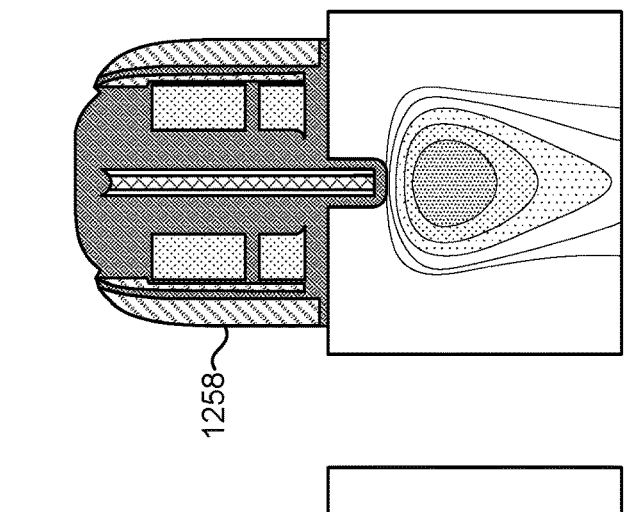
Figure 12S:
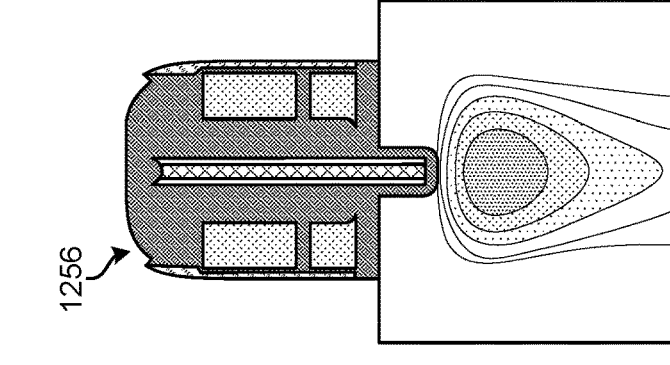
Figure 12R:
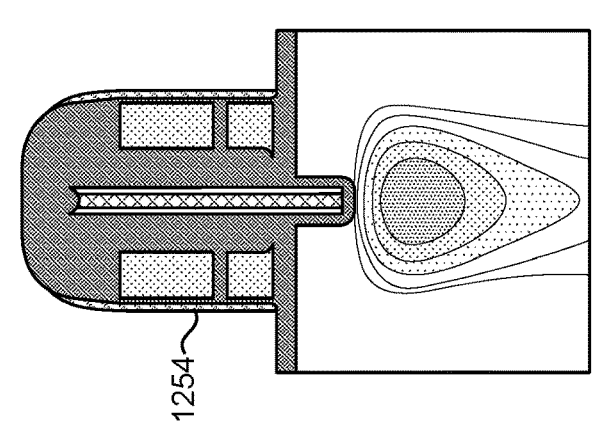
Figure 12Q:
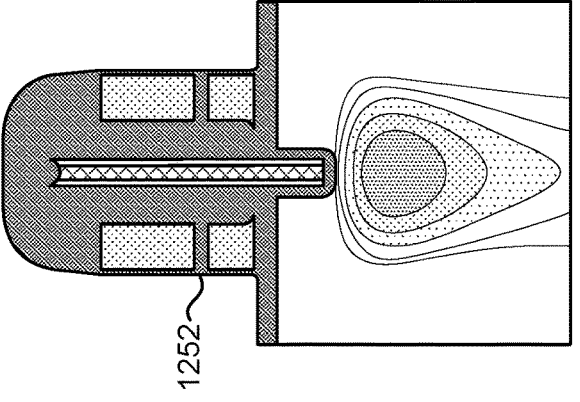
Figure 12V:
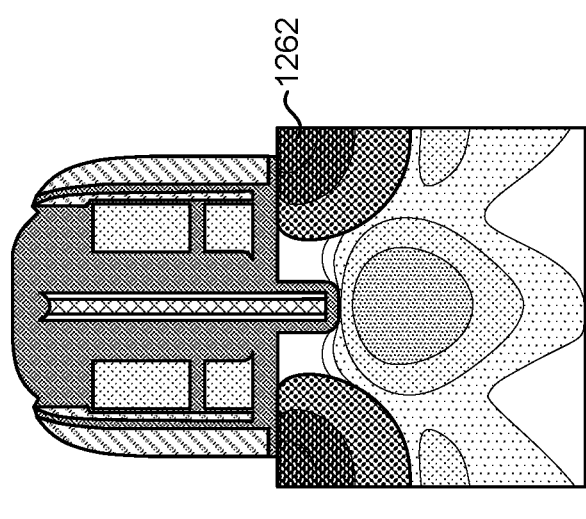

Attention is now directed to FIGS. 12A-12V, which illustrate a process for manufacturing a pair of electrically erasable programmable nonvolatile memory cells, including electrically erasable programmable nonvolatile memory cell 1200/1201, in accordance with some embodiments. FIGS. 12A-12V show cross-section views of a pair of memory cells 1200, 1201, as the manufacturing process progresses. It is noted that the structures shown in FIGS. 12A-12V, as well as FIGS. 12W, 13A-13V, and 13W, are not drawn to scale, and some features are shown at disproportionately larger sizes in order for those features to be visible in these figures.

As shown in FIG. 12A, the process manufacturing a electrically erasable programmable nonvolatile memory cell begins with a substrate 1202 on which is disposed an insulator layer 1204 and a floating gate layer 1206 (e.g., polysilicon). FIG. 12A shows a cross-section view of silicon substrate 1202, dielectric layer 1204 (e.g., thermal silicon dioxide or low-trap silicon nitride), and floating gate layer 1206 (e.g., polysilicon). In some embodiments, the polysilicon floating gate layer 1206 has a thickness of 200 angstroms to 400 angstroms (200 Å to 400 Å), e.g., a thickness of 300 Å, within a margin of ten percent (10%). Dielectric layer 1204 is sometimes called a floating gate oxide layer, as it positioned between floating gate layer 1206 and substrate 1202.

Next, as shown in FIG. 12B, a sequence of additional layers 1208-1216 are deposited of the structure shown in FIG. 12A, including a dielectric (e.g., oxide) layer 1208 (sometimes called a coupling oxide/dielectric or word line gate oxide/dielectric), polysilicon layer 1210 (sometimes called the Poly2 layer or word line layer), a stacking dielectric (e.g., oxide) layer 1212, silicon nitride (e.g., $Si_3N_4$) layer 1214, and another dielectric (e.g., oxide) layer 1216 on top. In some embodiments, dielectric layer 1216 serves to protect memory structure elements below dielectric layer 1216 during subsequent processing.

As shown in FIG. 12C, using a mask 1220 and appropriate etchants and processes (e.g., anisotropic etching), a trench 1222 is opened in the structure shown in FIG. 12B, removing the portions of dielectric layer 1216, silicon nitride layer 1214 and stacking dielectric layer 1212 not protected by mask 1220. The etch operation depicted in FIG. 12C stops at silicon nitride layer 1210. It is noted that reference 1222 is used herein to identify the trench, even as the shape (e.g., width and depth) of the trench are changed during subsequent processing steps. At this initial stage, "trench" 1222 is not yet truly a trench, as it does not yet extend into substrate 1202.

Next, as shown in FIG. 12D, a word line (WL) spacer (e.g., a dielectric) material is deposited and etched back to form word line (WL) spacer 1224 on the outer vertical edges of trench 1222. As a result, the trench 1222 is substantially narrowed.

Next, as shown in FIG. 12E, using the WL spacer 1224 as a mask, anisotropic etching 1226 is used to etch the polysilicon word line layer 1210, and coupling oxide/dielectric layer 1208, and partially etch the polysilicon floating gate layer 1206, such that trench 1222 is now separated from the substrate 1202 by a portion of polysilicon floating gate layer 1206 and floating gate oxide/dielectric 1204.

Next, as shown in FIGS. 12F and 12G, an offset spacer 1228 (e.g., a dielectric material) is deposited and etched back to produce a narrower trench 1222 (for case of reference, the label 1222 continues to be applied to the "trench," even as the dimensions, including width and depth, of the trench change as processing continues) with the offset spacer 1128 separating the word line layer 1210 from the trench. A boundary between WL spacer 1224 and offset spacer 1228 is indicated by dashed lines. In some embodiments, WL spacer 1224 and offset spacer 1228 are formed from the same dielectric, e.g., silicon oxide.

Next, as shown in FIG. 12H, an etch operation, e.g., an isotropic etch, removes the remainder of the polysilicon layer 1206 at the bottom of trench 1222, and also etches a portion of polysilicon layer 1206 positioned below offset spacer 1228, adjacent to the bottom of trench 1222, thereby forming a polysilicon tip 1232 that faces trench 1222 (e.g., tip 1232 is the narrowest portion of polysilicon layer and is also the portion of the polysilicon floating gate 150 (see FIG. 12W), formed from polysilicon layer 1206, closest to trench 1222).

Next, as shown in FIG. 12I, a first tunnel oxide 1234 (e.g., a dielectric layer) is deposited in the trench 1222. At this point, the polysilicon tip 1232 is separated from the trench 1222 only by the first tunnel oxide 1234, while other portions of polysilicon layer 1206 (floating gate 150) and word line layer 1210 are separated from trench 1222 by offset spacer 1228 and first tunnel oxide 1234.

Next, as shown in FIG. 12J, an oxide etch (e.g., an anisotropic etch) operation is performed to extend trench 1222 into the substrate while minimizing etching of the first tunnel oxide 1234. In some embodiments, the lateral thickness of the first tunnel oxide 1234 after completion of the etching operation in FIG. 12J is approximately 70 Å (e.g., less than 100 Å), within a margin of 10 to 15 percent, and in some embodiments has a thickness of 50 Å to 100 Å. As shown in FIG. 12J, the floating gate 150 covers the entire portion of the floating gate oxide 164 except the portion, sometimes herein called an offset gap 1238, closest to the trench 1222. The presence of offset gap 1238 in the memory cell increases the floating gate threshold voltage (e.g., the voltage of the floating gate 150, relative to that of the substrate 102, needed to enable the flow of at least a predefined amount of current (e.g., the amount of current needed to determine, during a read operation, the state of memory cell 1200) through the channel 190 below the floating gate oxide 1204/164 (see FIG. 12W).

Next, as shown in FIG. 12K, a trench implant operation is performed, during which a trench implant 1240 is introduced into the substrate below trench 1222 (e.g., in a region of substrate 102 below the bottom of the trench 1222). In some embodiments, trench implant 1240 comprises an indium implant. Properties of the trench implant 1240 are discussed above with respect to trench implant 302 (e.g., to determine or increase the threshold voltage of the trench bottom portion of channel 190.

Next, typically after the trench implant, as shown in FIG. 12L, a second tunnel oxide 1242 (e.g., a dielectric layer) is deposited in the trench 1222. At this point, the polysilicon tip 1232 is separated from the trench by both the first tunnel oxide 1234 and second tunnel oxide 1242, while other portions of polysilicon layer 1206 (floating gate 150) and word line layer 1210 are separated from trench 1222 by offset spacer 1228, first tunnel oxide 1234 and second tunnel oxide 1242. The dashed lines in FIG. 12L indicate boundaries between WL spacer 1224, offset spacer 1228, first tunnel oxide 1234 and second tunnel oxide 1242. In some embodiments, the lateral thickness of the second tunnel oxide 1242 is approximately 80 Å, within a margin of 10 to 20 percent, and in some embodiments has a thickness of 50 Å to 110 Å.

Next, as shown in FIG. 12M, one or more conductive materials are deposited in the trench 1222 to form a control gate. In some embodiments, the conductive materials that form the control gate include polysilicon, and in some embodiments include metal, such as titanium nitride and/or tungsten. Further, as shown in FIG. 12M, an etch operation 1244 is performed to remove excess upper portions of the insulator layers and conductive materials that form the control gate. It is noted that an electrical connection to the control gate, e.g., to the control gates of other memory cell pairs in a same row or column or memory cells, is formed using conductors extending in a direction not visible in the cross-section view of FIG. 12M.

Next, as shown in FIG. 12N, dielectric material (e.g., oxide) is formed on the top of the memory cell pair and then planarized, for example using chemical-mechanical planarization (CMP). Thereafter, as shown in FIG. 12O, the silicon nitride structures formed from silicon nitride layer 1214 are removed by etching 1248, resulting in the structure shown in FIG. 12O. As shown in FIG. 12P, a further etch operation 1250 removes portions of the word line, floating gate and word line gate layers 1206, 1208, 1210 furthest from the control gate, so as to form the structure shown in FIG. 12P.

In FIG. 12P, portions of the polysilicon layers 1206, 1210 are exposed, and those portions are subsequently covered with a dielectric layer, as shown in FIG. 12Q to form a protective dielectric layer over the outside portions of the word line and floating gate.

Next, a first silicon nitride spacer 1254 is added to (e.g., deposited on and then anisotropically etched) outside portions of the memory pair structure, as shown in FIG. 12R, followed by an oxide etching operation, shown in FIG. 12S, and then a silicon oxide layer is deposited, followed by adding a second silicon nitride spacer outside portions of the memory pair structure, as shown in FIG. 12T.

Figure 12U:
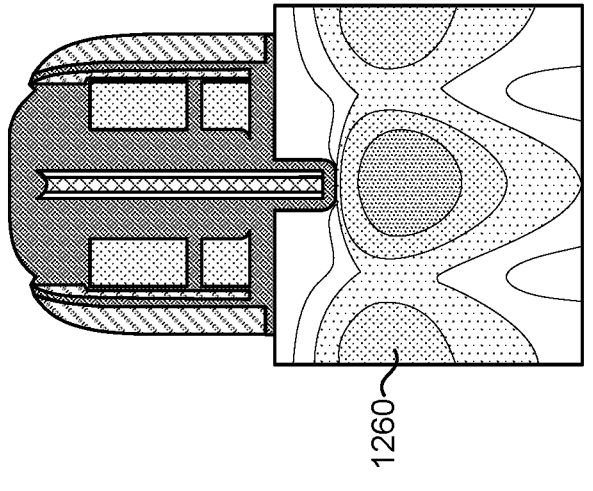

Next, as shown in FIG. 12U, a deep halo implant operation 1260 is performed, adding dopant, such as indium, in regions of the substrate below the drain/source regions (bit lie regions 104) of the two memory cells 1200, 1201. Properties the deep halo implant 1260 are discussed above with respect to deep halo implant 306.

Figure 12W:
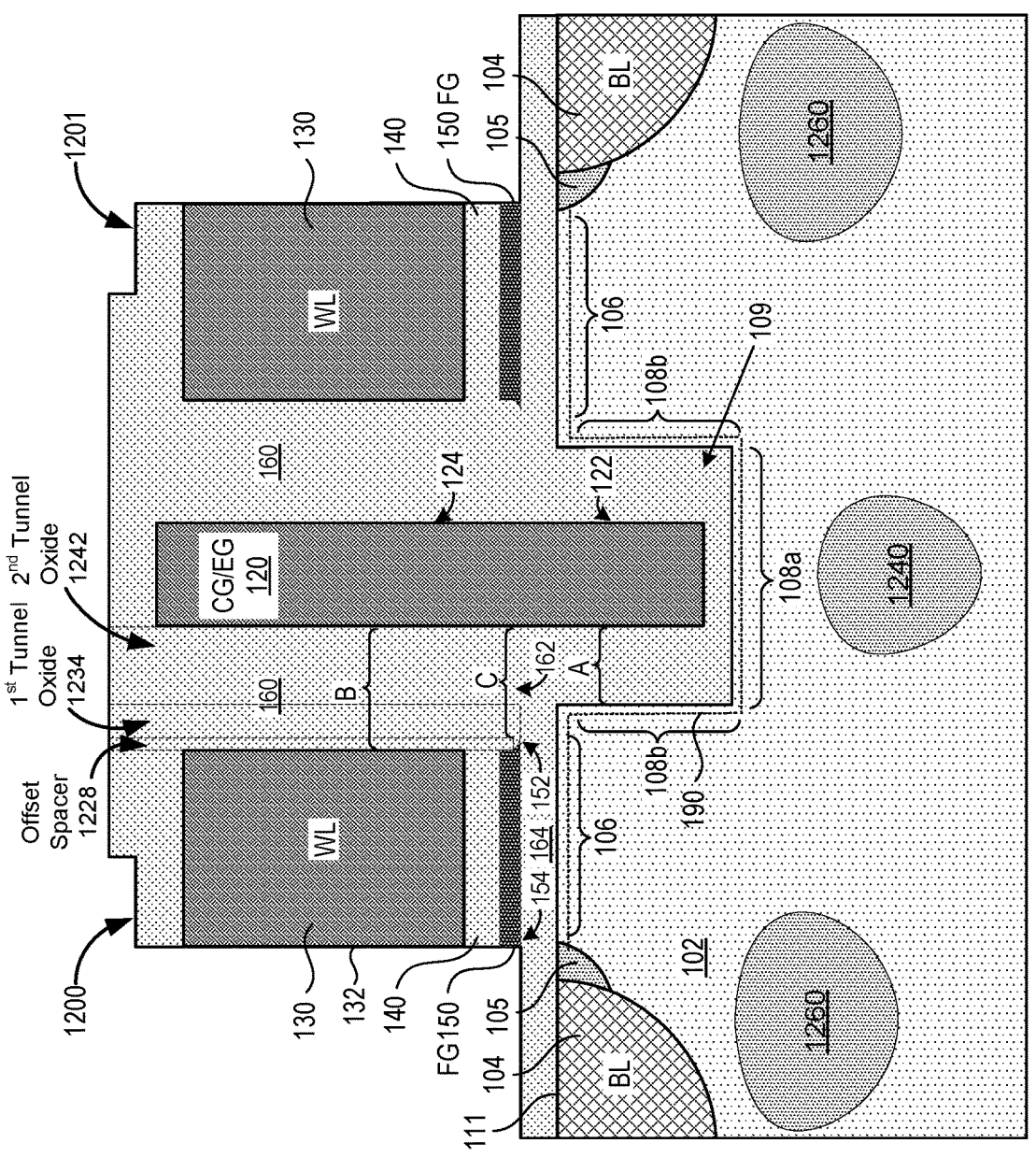

Finally, bit line (e.g., N+) and LDD implant operations are performed so as to form bit line and LDD regions for each memory cell 1200, 1201. The LDD implant is optional, depending on the needed threshold level of the floating gate 150 (see FIG. 12W). Further, as shown in FIG. 12W, the floating gate 150 (e.g., the remaining portion of floating gate region 1206 after the etch operation shown in FIG. 12P) does not overlap the LDD region 105 (regardless of whether the "LDD region" 105 is implanted with N+ dopant) of each memory cell 1200, 1201, thereby forming an offset region in the substrate 102 between the source/drain (bit line) region 104 and the portion of channel 190 covered by the floating gate 150. The LDD region 105 is sometimes herein referred to as the distal portion of the channel within the electrically erasable programmable nonvolatile memory cell that is furthest from the trench region and not overlaid by the floating gate 150.

2$^{nd}$ Memory Cell Structure

FIG. 12W shows a block diagram of the memory cell pair structure, which includes electrically erasable programmable nonvolatile memory cells 1200 and 1201, resulting from the manufacturing process described above. An example of a plan view of a memory cell array in accordance with embodiments using the memory cell pair structure of FIG. 12W is shown in FIG. 9. In some embodiments, memory cell 1200, includes:

a semiconductor substrate (102) having a bit line region (104), a surface region (106) apart from the bit line region in a lateral direction (e.g., horizontal direction in FIG. 12W), and a trench region apart from the surface region 106 in the lateral direction, the trench region comprising a bottom portion (108a) and a sidewall portion (108b) adjacent a trench (109) in the semiconductor substrate;

an electrically conductive control gate (120) comprising:
  a first portion (122) disposed inside the trench, insulated from the bottom portion and sidewall portion of the trench region of the substrate, and apart from a sidewall of the sidewall portion of the trench region by a first distance (A) in the lateral direction; and
  a second portion (124) disposed above and extending away from the trench (109);

an electrically conductive word line (130) insulated from the control gate (120) and offset from the second portion (124) of the control gate by a second distance (B) greater than the first distance (A) in the lateral direction;

a floating gate (150) (e.g., a polysilicon floating gate) insulated from the substrate (102) and the word line (130) and comprising:
  a first end (152), comprising a portion of the floating gate closest to the control gate, separated in the lateral direction from the second portion of the control gate by a third distance (C) that is greater than the first distance (A) and less than the second distance (B); and
  a second end (154) self-aligned with an edge 132 of the word line that is farthest from the second portion of the control gate.

In some embodiments, the second memory cell 1201 of the memory cell pair has the same structural components as the first memory cell 1200, except that both memory cells share the same control gate 120, and the components of the second memory cell 1201 are arranged as an mirror image of the components of the first memory cell 1200.

In some embodiments, as shown in FIG. 12W (and also in FIG. 12L) the electrically conductive word line is insulated from the control gate and offset from the second portion of the control gate by a sequence of insulators, comprising an offset spacer, a first tunnel oxide and a second tunnel oxide, the sequence of insulators separating the word line from the control gate by the second distance (B), which is greater than the first distance (A) in the lateral direction. Further, in such embodiments, the first end (152) of the floating gate is separated from the second portion (124) of the control gate (120) by the first tunnel oxide and the second tunnel oxide, but not the offset spacer.

In some embodiments, the second tunnel oxide, but not the first tunnel oxide, extends into the trench.

In some embodiments, the memory cell 1200 further includes a first indium implant (1240) disposed in a region of the substrate below the bottom portion of the trench region; and a second indium implant (1260) disposed in a region of the substrate adjacent to a source or drain region of the memory cell. Further, in some embodiments, the first indium implant causes a threshold voltage of a channel in the bottom portion of the trench region to control a programming current at 100 nA with a control gate voltage between 1.6V and 2.0V during a program operation, and the floating gate is configured to reach a programmed state upon application of the programming current in 20 ns or less. In some embodiments, the second indium implant, in combination with the first indium implant, causes (i) a punch-through current of unselected rows of memory cells to be 10 pA or lower, and (ii) a read current to be insensitive, within a tolerance of 10%, to a program/erase status of a mirror cell (e.g., memory cell 1201).

In some embodiments, a lateral extent of the first tunnel oxide corresponds to a portion of a channel (190, FIG. 12W), in the substrate, running from the bit line region (104) of the substrate (102) to the sidewall portion of the trench region (109), that is not overlaid by the floating gate (150); see FIG. 12W. Stated another way, the width (or lateral extent) of the first tunnel oxide corresponds to the offset gap 1238 shown in FIG. 12J. See above discussion of FIG. 12J.

In some embodiments, an erase gate insulation region (162, FIG. 12W) is disposed between the first end (152) of the floating gate (150) and the second portion (124) of the control gate (120), the erase gate insulation region corresponds to portions of the first tunnel oxide and second tunnel oxide disposed between the first end of the floating gate and the second portion of the control gate, and the erase gate insulation region has a thickness permitting tunneling of electrons from the first end of the floating gate to the second portion of the control gate during an erase operation. In some embodiments, the erase gate insulation region thickness is greater than 120 Å (e.g., 150 Å, within an error margin of 10% or 15%) and permits tunneling of electrons upon application of no greater than 7V between the control gate and the floating gate.

In some embodiments, the floating gate comprises polysilicon having a thickness between 200 Å and 400 Å, and a tip at the first end having a thickness of less than 20 Å.

In some embodiments, the control gate is configured to function as an erase gate during an erase operation.

In some embodiments, the memory cell 1200 includes a floating gate insulation region (164) disposed between the surface region of the substrate and the floating gate, wherein the floating gate insulation region has a thickness permitting head-on injection of electrons traveling in an upward path to the floating gate during a program operation.

In some embodiments, a word line potential of the word line, a control gate potential of the control gate, and a bit line potential of the bit line region are configured to enable electrons to travel underneath the bottom portion of the trench region and then upward toward the floating gate during a program operation.

In some embodiments, the floating gate 150 is configured to reach a programmed state in 20 ns or less during a program operation.

In some embodiments, the word line (130) is electrically connected to a word line (130) of a mirror memory cell; the electrically erasable programmable nonvolatile memory cell (1200) and the mirror memory cell (1201) form a four-node memory cell pair, the four nodes consisting of a source node, a drain node, a word line node, and a control/erase node; and the word line node comprises the electrically connected word lines, the control/erase node comprises the control gate, which is shared by the electrically erasable programmable nonvolatile memory cell (1200) and the mirror memory cell (1201), and the source node or drain node comprises or is electrically connected to the bit line region (104) of the electrically erasable programmable nonvolatile memory cell (1200). Alternatively, the word line (130) is not electrically connected to the word line (130) of the mirror memory cell; the electrically erasable programmable nonvolatile memory cell (1200) and the mirror memory cell (1201) form a five-node memory cell pair, the five nodes consisting of a source node, a drain node, a first word line node (for the first memory cell 1200) and a second word line node (for the mirror memory cell 1201), and a control/erase node; and the first word line node comprises the word line of the first memory cell, the second word line node comprises the word line of the mirror memory cell, the control/erase node comprises the control gate, which is shared by the electrically erasable programmable nonvolatile memory cell (1200) and the mirror memory cell (1201), source node comprises or is electrically connected to the bit line region (104) of the electrically erasable programmable nonvolatile memory cell (1200), and the drain node comprises or is electrically connected to the bit line region (104) of the electrically erasable programmable nonvolatile mirror memory cell (1201).

4 and 5 Node Configurations of Memory Cell Pair

The memory cell pair shown in FIG. 12W, which includes two memory cells 1200 and 1201 that share a control gate, can be used as either a four node device, with the word lines of both memory cells being electrically connected to the same node and are controlled together, or as a five node device in which the word lines of the two memory cells are separately controlled. The following tables show examples of control voltages to be applied to the nodes of the four node device, and the five node device, for performing, read operations (first and second memory cells), program operations (first and second memory cells), and erase operations. Unless otherwise indicates, all voltage examples for operating pair of memory cells are to be considered voltage ranges that vary by up to 10% of the control voltage examples provided in the tables herein.

TABLE 1

| Control Voltages for 4 Node Memory Cell Pair, Polysilicon Floating Gates | | | | |
|---|---|---|---|---|
| | Bit Line Memory Cell 1200 | Bit Line Memory Cell 1201 | Word Lines | Control Gate |
| Read Memory Cell 1200 | 0 V | 1.2 V to 1.8 V | 0 V | 2.4 V to 3.6 V |
| Read Memory Cell 1201 | 1.2 V to 1.8 V | 0 V | 0 V | 2.4 V to 3.6 V |
| Program Memory Cell 1200 | 4 V to 5 V | 0 V to 0.2 V | 7 V to 8 V | 1.6 V to 2.0 V |
| Program Memory Cell 1201 | 0 V to 0.2 V | 4 V to 5 V | 7 V to 8 V | 1.6 V to 2.0 V |
| Erase both Memory Cells | 0 V | 0 V | −7 V to −8 V | 5 V to 6 V |

TABLE 2

Control Voltages for 5 Node Memory Cell Pair, Polysilicon Floating Gates

| | Bit Line Mem Cell 1200 | Bit Line Mem Cell 1201 | WL Mem Cell 1200 | WL Mem Cell 1201 | Control Gate |
|---|---|---|---|---|---|
| Read Memory Cell 1200 | 0 V | 1.2 V to 1.8 V | 0 V | 2.4 V to 3.6 V | 2.4 V to 3.6 V |
| Read Memory Cell 1201 | 1.2 V to 1.8 V | 0 V | 2.4 V to 3.6 V | 0 V | 2.4 V to 3.6 V |
| Program Memory Cell 1200 | 4 V to 5 V | 0 V to 0.2 V | 7 V to 8 V | 7 V to 8 V | 2.4 V to 3.6 V |
| Program Memory Cell 1201 | 0 V to 0.2 V | 4 V to 5 V | 7 V to 8 V | 7 V to 8 V | 2.4 V to 3.6 V |
| Erase both Memory Cells | 0 V | 0 V | –7 V to –8 V | –7 V to –8 V | 5 V to 6 V |

Third Manufacturing Process

Figures 13A, 13B, 13C, 13D:
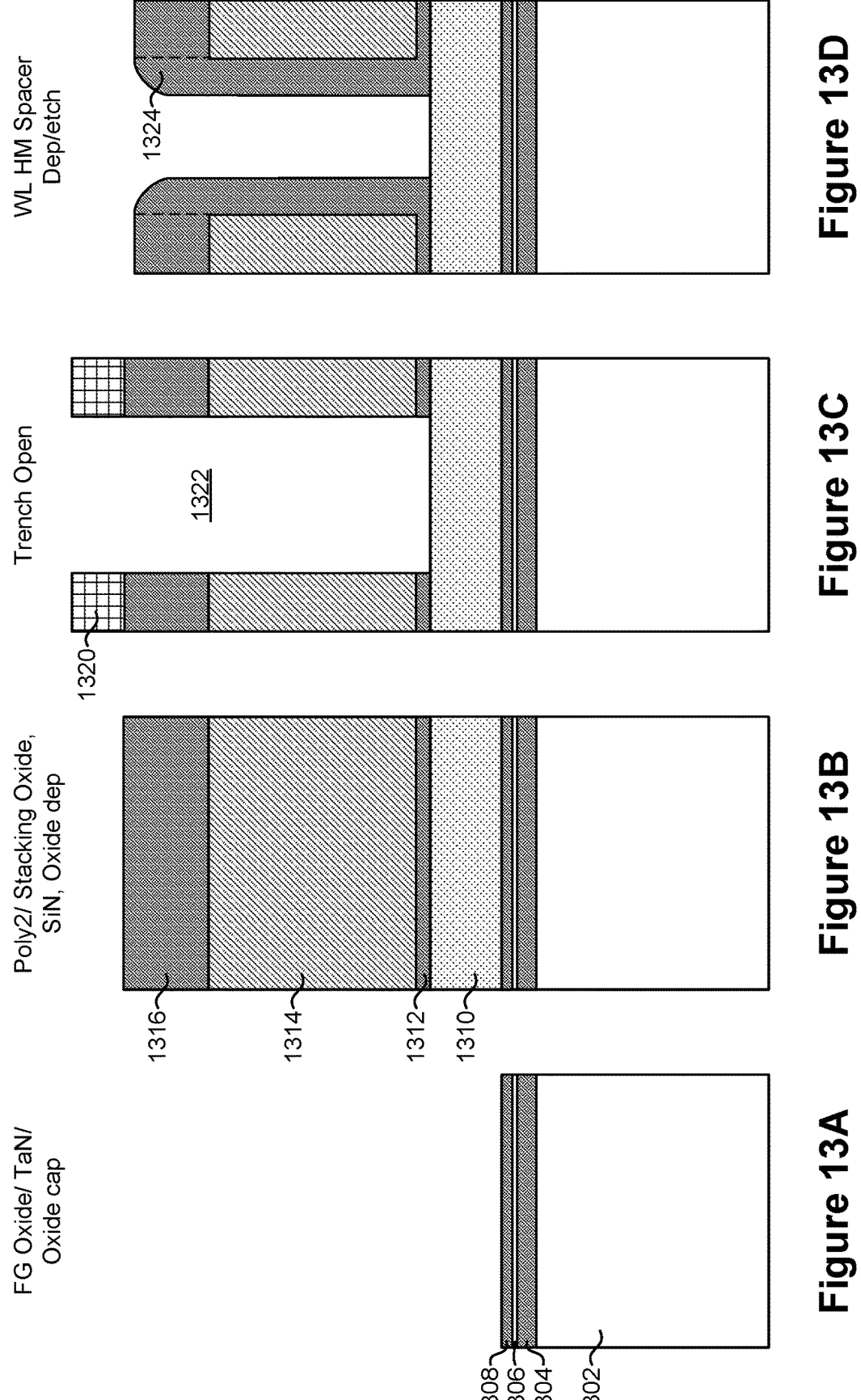
FIGS. 13A-13V and 13W illustrate a process for manufacturing an array of electrically erasable programmable nonvolatile memory cells, each having a tantalum nitride floating gate, in accordance with some embodiments, and a block diagram of a resulting pair of memory cells.
Figures 13E, 13F, 13G, 13H:
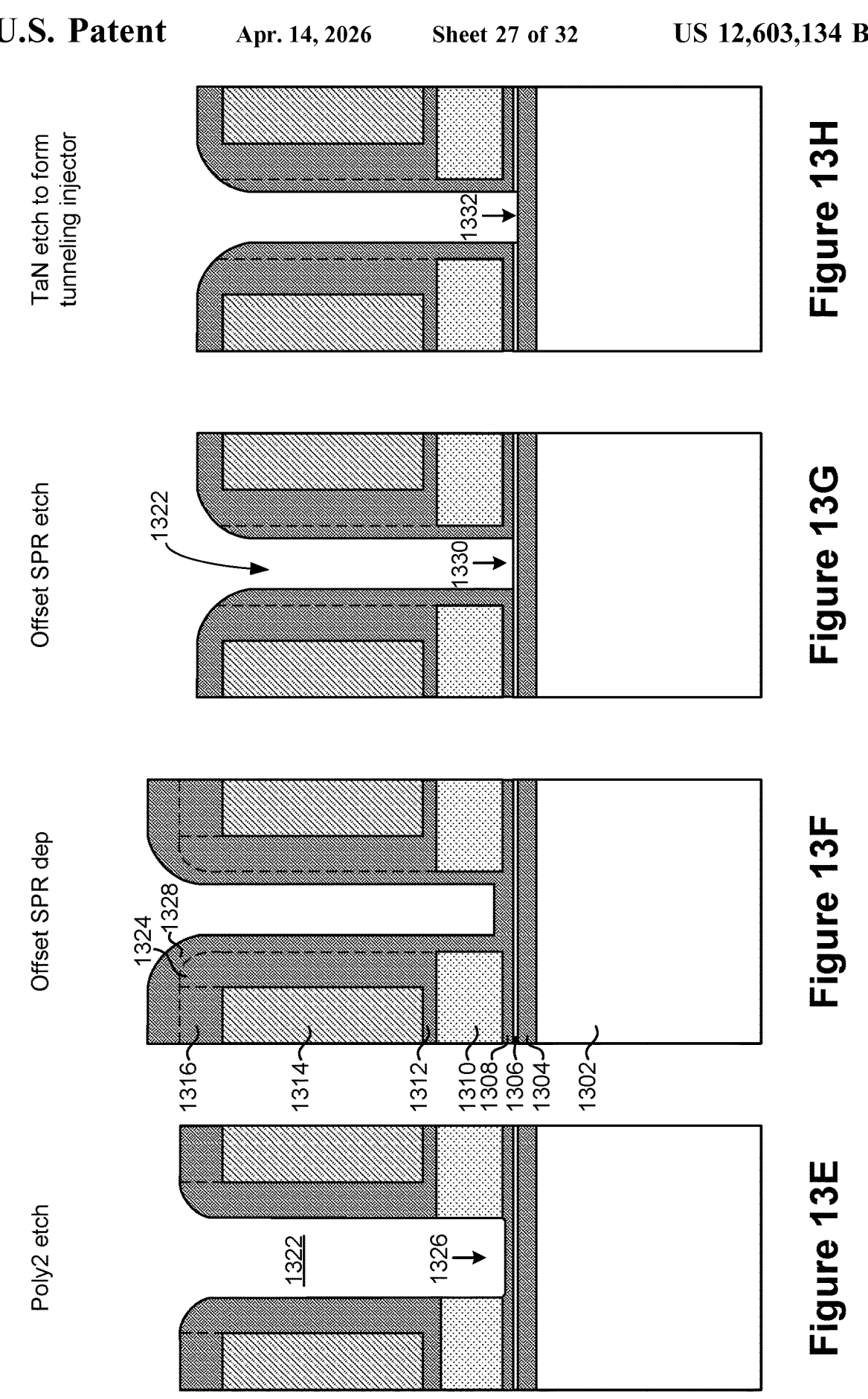
Figures 13I, 13J, 13K, 13L:
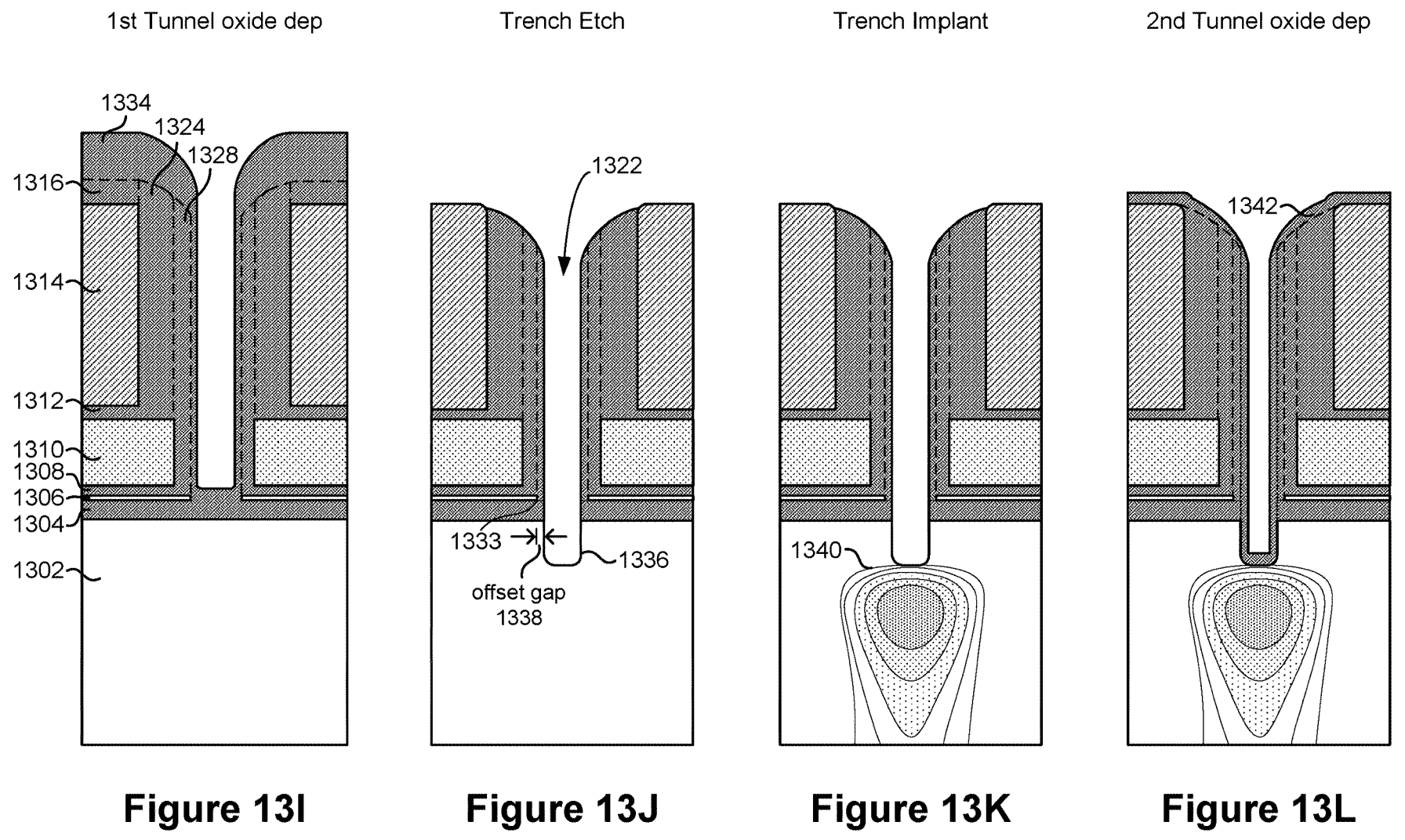
Figures 13M, 13N, 13O, 13P:
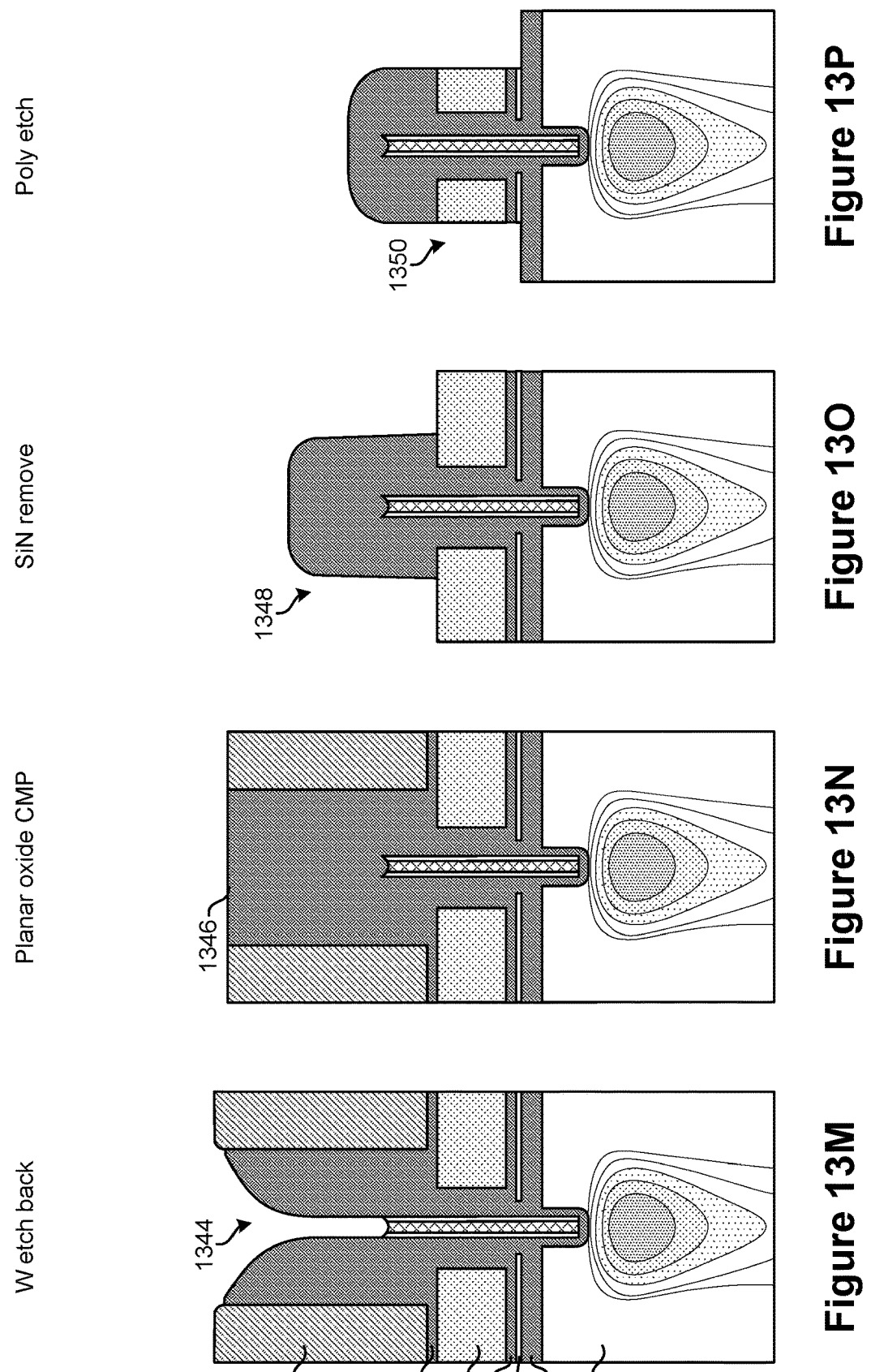
Figures 13Q, 13R, 13S, 13T:
Figure 13V:
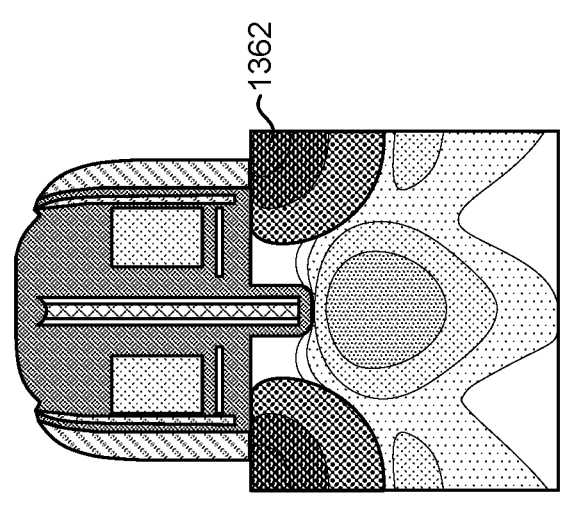

FIGS. 13A-13V illustrate a process for manufacturing a pair of electrically erasable programmable nonvolatile memory cells, including electrically erasable programmable nonvolatile memory cell 1300/1301, that have tantalum nitride floating gates, in contrast to the polysilicon floating gates of the pair of memory cells manufacturing using the process of FIGS. 12A-12V. As indicated below in the description of this third manufacturing process, many parts of the manufacturing process of FIGS. 13A-13V are the same as in the manufacturing process of FIGS. 12A-12V.

FIGS. 13A-13V show cross-section views of a pair of memory cells 1300, 1301, as the manufacturing process progresses. It is noted that the structures shown in FIGS. 13A-13V, as well as FIG. 13W, are not drawn to scale, and some features are shown at disproportionately larger sizes in order for those features to be visible in these figures.

As shown in FIG. 13A, the process manufacturing a electrically erasable programmable nonvolatile memory cell begins with a substrate 1302 on which is disposed an insulator layer 1304 and a floating gate layer 1306 (e.g., tantalum nitride (TaN)). FIG. 13A shows a cross-section view of silicon substrate 1302, dielectric layer 1304 (e.g., thermal silicon dioxide or low-trap silicon nitride), floating gate layer 1306 (e.g., TaN), and a dielectric (e.g., oxide) layer 1308 (sometimes called a coupling oxide/dielectric or word line gate oxide/dielectric). In some embodiments, the TaN floating gate layer 1306 has a thickness of 8 angstroms to 20 angstroms (8 Å to 20 Å), e.g., a thickness of 10 Å, within a margin of ten percent (10%). Dielectric layer 1304 is sometimes called a floating gate oxide layer, as it positioned between floating gate layer 1306 and substrate 1302.

Next, as shown in FIG. 13B, a sequence of additional layers 1310-1316 are deposited of the structure shown in FIG. 13A, including polysilicon layer 1310 (sometimes called the Poly2 layer or word line layer), a stacking dielectric (e.g., oxide) layer 1312, silicon nitride (e.g., $Si_3N_4$) layer 1314, and another dielectric (e.g., oxide) layer 1316 on top. In some embodiments, dielectric layer 1316 serves to protect memory structure elements below dielectric layer 1316 during subsequent processing.

As shown in FIG. 13C, using a mask 1320 and appropriate etchants and processes (e.g., anisotropic etching), a trench 1322 is opened in the structure shown in FIG. 13B, removing the portions of dielectric layer 1316, silicon nitride layer 1314 and stacking dielectric layer 1312 not protected by mask 1320. The etch operation depicted in FIG. 13C stops at silicon nitride layer 1310. It is noted that reference 1322 is used herein to identify the trench, even as the shape (e.g., width and depth) of the trench are changed during subsequent processing steps. At this initial stage, "trench" 1322 is not yet truly a trench, as it does not yet extend into substrate 1302.

Next, as shown in FIG. 13D, a word line (WL) spacer (e.g., a dielectric) material) is deposited and etched back to form word line (WL) spacer 1324 on the outer vertical edges of trench 1322. As a result, the trench 1322 is substantially narrowed.

Next, as shown in FIG. 13E, using the WL spacer 1324 as a mask, anisotropic etching 1326 (e.g., polysilicon etching) is used to etch the polysilicon word line layer 1310, such that trench 1322 is now separated from the substrate 1302 by TaN floating gate layer 1306 and floating gate oxide/dielectric 1304.

Next, as shown in FIGS. 13F and 13G, an offset spacer 1328 (e.g., a dielectric material) is deposited and etched back 1330 to produce a narrower trench 1322 (for case of reference, the label 1322 continues to be applied to the "trench," even as the dimensions, including width and depth, of the trench change as processing continues) with the offset spacer 1328 separating the word line layer 1310 from the trench. A boundary between WL spacer 1324 and offset spacer 1328 is indicated by dashed lines. In some embodiments, WL spacer 1324 and offset spacer 1328 are formed from the same dielectric, e.g., silicon oxide.

Next, as shown in FIG. 13H, an etch operation 1332, e.g., an isotropic etch, removes the TaN layer 1306 at the bottom of trench 1322, thereby forming an end (TaN tip) of the TaN layer 1306 that faces trench 1322 (e.g., TaN tip 1333 is the portion of the TaN floating gate 150 (see FIG. 13W), formed from TaN layer 1306, closest to trench 1322).

Next, as shown in FIG. 13I, a first tunnel oxide 1334 (e.g., a dielectric layer) is deposited in the trench 1322. Then, as shown in FIG. 13J, an oxide etch (e.g., an anisotropic etch) operation is performed to extend trench 1322 into the substrate while minimizing etching of the first tunnel oxide 1334. At this point, the TaN tip 1333 is separated from the trench 1322 by the first tunnel oxide 1334, while word line layer 1310 is separated from trench 1322 by offset spacer 1328 and first tunnel oxide 1334.

In some embodiments, the lateral thickness of the first tunnel oxide 1334 after completion of the etching operation in FIG. 13J is approximately 70 Å, within a margin of 10 to 15 percent, and in some embodiments has a thickness of 50 Å to 100 Å. As shown in FIG. 13W, the floating gate 150 (corresponding to TaN layer 1306) covers the entire portion of the floating gate oxide 164 except the portion, sometimes herein called an offset gap 1338, closest to the trench 1322. The presence of offset gap 1338 in the memory cell increases the floating gate threshold voltage (e.g., the voltage of the floating gate 150, relative to that of the substrate 102, needed to enable the flow of at least a predefined amount of current (e.g., the amount of current needed to determine, during a read operation, the state of memory cell 1300) through the channel 190 below the floating gate oxide 1304/164 (see FIG. 13W).

Next, as shown in FIG. 13K, a trench implant operation is performed, during which a trench implant 1340 is introduced into the substrate below trench 1322 (e.g., in a region of substrate 102 below the bottom of the trench 1322). In some embodiments, trench implant 1340 comprises an indium implant. Properties the trench implant 1340 are discussed above with respect to trench implant 302 (e.g., to determine or increase the threshold voltage of the trench bottom portion of channel 190.

Next, typically after the trench implant, as shown in FIG. 13L, a second tunnel oxide 1342 (e.g., a dielectric layer) is deposited in the trench 1322. At this point, the TaN tip 1333 is separated from the trench by both the first tunnel oxide 1334 and second tunnel oxide 1342, while word line layer 1310 is separated from trench 1322 by offset spacer 1328, first tunnel oxide 1334 and second tunnel oxide 1342. The dashed lines in FIG. 13L indicate boundaries between WL spacer 1324, offset spacer 1328, first tunnel oxide 1334 and second tunnel oxide 1342. In some embodiments, the lateral thickness of the second tunnel oxide 1342 is approximately 80 Å, within a margin of 10 to 20 percent, and in some embodiments has a thickness of 50 Å to 110 Å.

Next, as shown in FIG. 13M, one or more conductive materials are deposited in the trench 1322 to form a control gate. In some embodiments, the conductive materials that form the control gate include polysilicon, and in some embodiments include metal, such as titanium nitride and/or tungsten. Further, as shown in FIG. 13M, an etch operation 1344 is performed to remove excess upper portions of the insulator layers and conductive materials that form the control gate. It is noted that an electrical connection to the control gate, e.g., to the control gates of other memory cell pairs in a same row of memory cells, is formed using conductors extending in a direction not visible in the cross-section view of FIG. 13M.

Next, as shown in FIG. 13N, dielectric material (e.g., oxide) is formed on the top of the memory cell pair and then planarized, for example using chemical-mechanical planarization (CMP). Thereafter, as shown in FIG. 13O, the silicon nitride structures formed from silicon nitride layer 1314 are removed by etching 1348, resulting in the structure shown in FIG. 13O. As shown in FIG. 13P, a further etch operation 1350 removes portions of the word line, floating gate and word line gate layers 1306, 1308, 1310 furthest from the control gate, so as to form the structure shown in FIG. 13P.

In FIG. 13P, portions of the TaN layer 1306 and polysilicon layer 1310 are exposed, and those portions are covered with a deposited dielectric layer 1352 in a subsequent step, as shown in FIG. 13Q to form a protective dielectric layer over the outside portions of the word line and floating gate.

Next, a first spacer 1354 is added to (e.g., deposited on and then anisotropically etched) outside portions of the memory pair structure, as shown in FIG. 13R, followed by an oxide etching operation, shown in FIG. 13S, and then a second spacer is added to (e.g., deposited on and then anisotropically etched) outside portions of the memory pair structure, as shown in FIG. 13T.

Figure 13U:
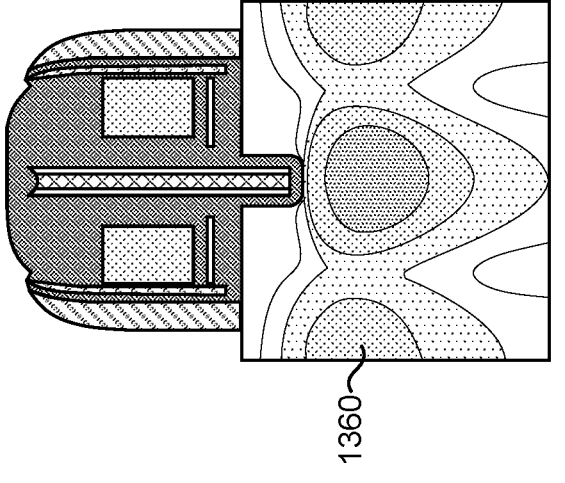
Figure 13W:
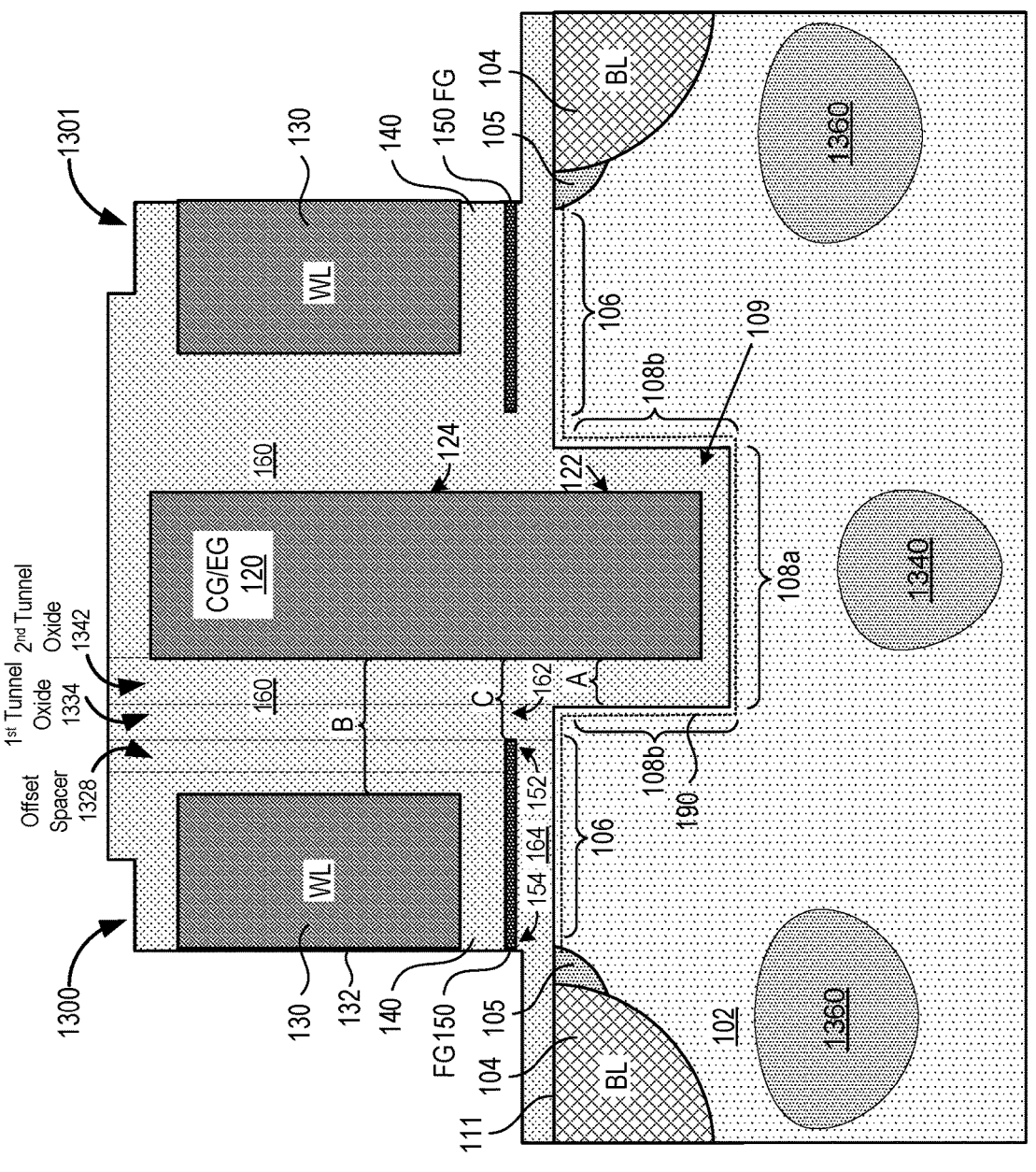

Next, as shown in FIG. 13U, a deep halo implant operation 1360 is performed, adding dopant, such as indium, in regions of the substrate below the drain/source regions (bit lie regions 104) of the two memory cells 1300, 1301. Properties of the deep halo implant 1360 are discussed above with respect to deep halo implant 306.

Finally, bit line (e.g., N+) and LDD implant operations are performed so as to form bit line and LDD regions for each memory cell 1300, 1301. The LDD implant is optional, depending on the needed threshold level of the floating gate 150 (see FIG. 13W). Further, as shown in FIG. 13W, the floating gate 150 (e.g., the remaining portion of floating gate region 1306 after the etch operation shown in FIG. 13P) does not overlap the LDD region 105 (regardless of whether the "LDD region" 105 is implanted with N+ dopant) of each memory cell 1300, 1301, thereby forming an offset region in the substrate 102 between the source/drain (bit line) region 104 and the portion of channel 190 covered by the floating gate 150. The LDD region 105 is sometimes herein referred to as the distal portion of the channel within the electrically erasable programmable nonvolatile memory cell that is furthest from the trench region and not overlaid by the floating gate 150.

In some embodiments, a method of manufacturing an electrically erasable programmable nonvolatile memory cell, such as the method of manufacturing depicted by the sequence of FIGS. 12A-12V, or the method of manufacturing depicted by FIGS. 13A-13V, includes: after forming a base structure, including a sequence of layers on a substrate, the sequence of layers including a floating gate layer separated from the substrate by a floating gate insulation layer, a word line layer separated from the floating gate layer by a dielectric layer, and one or more protective layers over the word line layer:

1) forming a trench through the sequence of layers so as to form electrically separate portions of the floating gate layer and word line layer, including a first floating gate region and first word line region for a first memory cell and a second floating gate region and second word line region for a second memory cell in a pair of memory cells, as well as first and second protective regions, positioned above the first and second word line regions, respectively, for the first and second memory cells;

2) forming, in sequence, within the trench, an offset spacer, a first tunnel oxide and a second tunnel oxide, such that portions of the first floating gate region and second floating gate region closest to the trench are separated from a control gate formed in the trench by the first tunnel oxide and second tunnel oxide but not the offset spacer, and the first word line and second word line are separated from the trench by the offset spacer, first tunnel oxide and second tunnel oxide; and 3) forming the control gate in the trench.

In some embodiments, in the aforementioned method of manufacturing, a portion of the trench extends into the substrate, and the second tunnel oxide but not the first tunnel oxide extends into the portion of the trench that extends into the substrate.

In some embodiments, the aforementioned method of manufacturing includes forming a conductive control gate within the trench, wherein the conductive control gate is a control gate for both the first memory cell and the second memory cell of the pair of memory cells.

In some embodiments, in the aforementioned method of manufacturing, the first tunnel oxide has a lateral thickness of less than 100 Å. Similarly, in some embodiments, in the aforementioned method of manufacturing, the second tunnel oxide has a lateral thickness of less than 100 Å.

In some embodiments, the aforementioned method of manufacturing, includes: forming a first indium implant in a region of the substrate below a bottom portion of the trench; and forming a second indium implant in a region of the substrate adjacent to a source/drain region of the first memory cell and a source/drain region of the second memory cell.

3$^{rd}$ Memory Cell Structure

FIG. 13W shows a block diagram of the memory cell pair structure, which includes electrically erasable programmable nonvolatile memory cells 1300 and 1301, resulting from the manufacturing process described above. An example of a plan view of a memory cell array in accordance with embodiments using the memory cell pair structure of FIG. 13W is shown in FIG. 9. In some embodiments, memory cell 1300, includes the same elements as those described above for memory cell 1200, except that the floating gate (150) is formed from, or comprises, tantalum nitride (TaN) instead of polysilicon. The TaN floating gate typically has a thickness of 8 angstroms to 20 angstroms (8 Å to 20 Å), e.g., a thickness of 10 Å, within a margin of ten percent (10%). Tip 1333 (see FIG. 13H) of the TaN floating gate, comprising the portion of the TaN floating gate closest to the control gate, typically has a same thickness as the TaN floating gate, e.g., 8 Å to 20 Å.

The above discussion of four and five node implementations (configurations) of memory cell pair 1200/1201 is equally applicable to memory cell pair 1300/1301, and the control voltages shown in Tables 1 and 2 above are also equally applicable to memory cells 1300 and 1301, optionally with adjustments that take into consideration the floating gate threshold voltage difference between that of tantalum nitride and polysilicon floating gates.

The foregoing description has been described with reference to specific implementations. However, the illustrative discussions above are not intended to be exhaustive or to limit the claims to the precise forms disclosed. Many variations, including memory device structures other than a floating gate, e.g. a charge-trapping memory device structure, or mask-programmable read-only-memory (mask-ROM), are possible in view of the above teachings. The implementations were chosen and described to best explain principles of operation and practical applications, to thereby enable others skilled in the art.

The various drawings illustrate a number of elements in a particular order. However, elements that are not order dependent may be reordered and other elements may be combined or separated. While some reordering or other groupings are specifically mentioned, others will be obvious to those of ordinary skill in the art, so the ordering and groupings presented herein are not an exhaustive list of alternatives.

What is claimed is:

1. An electrically erasable programmable nonvolatile memory cell comprising:
a semiconductor substrate having a bit line region, a surface region apart from the bit line region in a lateral direction, and a trench region apart from the surface region in the lateral direction, the trench region comprising a bottom portion and a sidewall portion adjacent a trench in the semiconductor substrate;
an electrically conductive control gate comprising:
a first portion disposed inside the trench, insulated from the bottom portion and sidewall portion of the trench region of the substrate, and apart from a sidewall of the sidewall portion of the trench region by a first distance (A) in the lateral direction; and
a second portion disposed above and extending away from the trench;
an electrically conductive word line insulated from the control gate and offset from the second portion of the control gate by a second distance (B) greater than the first distance in the lateral direction;
a floating gate insulated from the substrate and the word line and comprising:
a first end, comprising a portion of the floating gate closest to the control gate, separated in the lateral direction from the second portion of the control gate by a third distance that is greater than the first distance and less than the second distance; and
a second end self-aligned with an edge 132 of the word line that is farthest from the second portion of the control gate.

2. The electrically erasable programmable memory cell of claim 1, wherein
the electrically conductive word line is insulated from the control gate and offset from the second portion of the control gate by a sequence of insulators, comprising an offset spacer, a first tunnel oxide and a second tunnel oxide, the sequence of insulators separating the word line from the control gate by the second distance, which is greater than the first distance in the lateral direction; and
the first end of the floating gate is separated from the second portion of the control gate by the first tunnel oxide and the second tunnel oxide, but not the offset spacer.

3. The electrically erasable programmable memory cell of claim 2, wherein the second tunnel oxide, but not the first tunnel oxide, extends into the trench.

4. The electrically erasable programmable nonvolatile memory cell of claim 1,
a first indium implant disposed in a region of the substrate below the bottom portion of the trench region; and
a second indium implant disposed in a region of the substrate adjacent to a source or drain region of the memory cell.

5. The electrically erasable programmable nonvolatile memory cell of claim 4, wherein:
the first indium implant causes a threshold voltage of a channel in the bottom portion of the trench region to control a programming current at 100 nA with a control gate voltage between 1.6V and 2.0V during a program operation;
wherein the floating gate is configured to reach a programmed state upon application of the programming current in 20 ns or less.

6. The electrically erasable programmable nonvolatile memory cell of claim 4, wherein:
the first and the second indium implants cause (i) a punch-through current of unselected rows of memory cells to be 10 pA or lower, and (ii) a read current to be insensitive, within a tolerance of 10%, to a program/erase status of a mirror cell.

7. The electrically erasable programmable nonvolatile memory cell of claim 2, wherein a lateral extent of the first tunnel oxide corresponds to a portion of a channel, in the substrate, running from the bit line region of the substrate to the sidewall portion of the trench region, that is not overlaid by the floating gate.

8. The electrically erasable programmable nonvolatile memory cell of claim 2, wherein a distal portion of a channel in the substrate, comprising a portion of the channel running from the bit line region of the substrate to the sidewall portion of the trench region that is within the electrically erasable programmable nonvolatile memory cell and that is furthest from the trench region, is not overlaid by the floating gate.

9. The electrically erasable programmable nonvolatile memory cell of claim 2, wherein an erase gate insulation region is disposed between the first end of the floating gate and the second portion of the control gate, the erase gate insulation region corresponds to portions of the first tunnel oxide and second tunnel oxide disposed between the first end of the floating gate and the second portion of the control gate, and the erase gate insulation region has a thickness permitting tunneling of electrons from the first end of the floating gate to the second portion of the control gate during an erase operation.

10. The electrically erasable programmable nonvolatile memory cell of claim 9, wherein the erase gate insulation region thickness is greater than 120 Å and permits tunneling of electrons upon application of no greater than 7V between the control gate and the floating gate.

11. The electrically erasable programmable nonvolatile memory cell of claim 1, wherein the floating gate comprises tantalum nitride having a thickness between 10 Å and 20 Å.

12. The electrically erasable programmable nonvolatile memory cell of claim 1, wherein the floating gate comprises polysilicon having a thickness between 200 Å and 400 Å, and a tip at the first end having a thickness of less than 20 Å.

13. The electrically erasable programmable nonvolatile memory cell claim 1, wherein the control gate is configured to function as an erase gate during an erase operation.

14. The electrically erasable programmable nonvolatile memory cell of claim 1, further comprising a floating gate insulation region disposed between the surface region of the substrate and the floating gate, wherein the floating gate insulation region has a thickness permitting head-on injection of electrons traveling in an upward path to the floating gate during a program operation.

15. The electrically erasable programmable nonvolatile memory cell of claim 1, wherein a word line potential of the word line, a control gate potential of the control gate, and a bit line potential of the bit line region are configured to enable electrons to travel underneath the bottom portion of the trench region and then upward toward the floating gate during a program operation.

16. The electrically erasable programmable nonvolatile memory cell of claim 1, wherein the floating gate is configured to reach a programmed state in 20 ns or less during a program operation.

17. The electrically erasable programmable nonvolatile memory cell of claim 1, wherein:

the word line is electrically connected to a word line of a mirror memory cell;

the electrically erasable programmable nonvolatile memory cell and the mirror memory cell form a four-node memory cell pair, the four nodes consisting of a source node, a drain node, a word line node, and a control/erase node; and the word line node comprises the electrically connected word lines, the control/erase node comprises the control gate, which is shared by the electrically erasable programmable nonvolatile memory cell and the mirror memory cell, and the source node or drain node comprises or is electrically connected to the bit line region of the electrically erasable programmable nonvolatile memory cell.

18. An electrically erasable programmable nonvolatile memory cell comprising:

a semiconductor substrate having a bit line region, a surface region apart from the bit line region in a lateral direction, and a trench region apart from the surface region in the lateral direction, the trench region comprising a bottom portion and a sidewall portion adjacent a trench in the semiconductor substrate;

an electrically conductive control gate comprising:

a first portion disposed inside the trench, insulated from the bottom portion and sidewall portion of the trench region of the substrate, and apart from the sidewall portion of the trench region by a first distance (A) in the lateral direction; and a second portion disposed above and extending away from the trench;

an electrically conductive word line insulated from the control gate and offset from the second portion of the control gate by a second distance (B) greater than the first distance in the lateral direction;

an electrically conductive floating gate insulated from the substrate and the word line and comprising:

a first end comprising a portion of the floating gate closest to the control gate; and a second end self-aligned with an edge 132 of the word line that is farthest from the second portion of the control gate;

a first indium implant disposed in a region of the substrate below the bottom portion of the trench region;

and a second indium implant disposed in a region of the substrate adjacent to a bottom of a source or drain region of the memory cell.

19. The electrically erasable programmable nonvolatile memory cell of claim 18, wherein the first end of the electrically conductive floating gate includes a top portion and a bottom portion adjacent the top portion, and the bottom portion of the floating gate extends in the lateral direction closer to the control gate than the top portion of the floating gate.

20. The electrically erasable programmable nonvolatile memory cell of claim 18, wherein the second indium implant causes a read current to be insensitive, within a tolerance of 10%, to a programmed/erase status of a mirror cell.

* * * * *